US012702001B2

(12) United States Patent
Francis et al.

(10) Patent No.: US 12,702,001 B2
(45) Date of Patent: Aug. 4, 2026

(54) DEVICES HAVING AND METHODS OF FORMING THERMALLY CONDUCTIVE SUBSTRATES

(71) Applicant: Akash Systems, Inc., San Francisco, CA (US)

(72) Inventors: Daniel Francis, San Francisco, CA (US); Frank Lowe, San Francisco, CA (US); Kyle Graham, San Francisco, CA (US); Felix Ejeckam, San Francisco, CA (US); Tyrone D. Mitchell, Jr., San Francisco, CA (US); Paul Saunier, San Francisco, CA (US)

(73) Assignee: Akash Systems, Inc., San Francisco, CA (US)

( * ) Notice: Subject to any disclaimer, the term of this patent is extended or adjusted under 35 U.S.C. 154(b) by 396 days.

(21) Appl. No.: 18/339,136

(22) Filed: Jun. 21, 2023

(65) Prior Publication Data

US 2024/0170362 A1 May 23, 2024

Related U.S. Application Data

(63) Continuation of application No. PCT/US2021/064909, filed on Dec. 22, 2021.

(Continued)

(51) Int. Cl.
*H10W 40/25* (2026.01)
(52) U.S. Cl.
CPC ................................. *H10W 40/254* (2026.01)
(58) Field of Classification Search
None
See application file for complete search history.

(56) References Cited

U.S. PATENT DOCUMENTS

| | | | | |
|---|---|---|---|---|
| 4,992,082 | A | | 2/1991 | Drawl et al. |
| 5,006,203 | A | * | 4/1991 | Purdes .................. C23C 16/271 |
| | | | | 427/249.7 |

(Continued)

FOREIGN PATENT DOCUMENTS

| | | |
|---|---|---|
| WO | WO-2020242494 A1 | 12/2020 |
| WO | WO-2020263845 A1 | 12/2020 |
| WO | WO-2022140575 A1 | 6/2022 |

OTHER PUBLICATIONS

PCT/US2020/039161 International Search Report and Written Opinion dated Nov. 18, 2020.

(Continued)

*Primary Examiner* — Benjamin P Sandvik
(74) *Attorney, Agent, or Firm* — Wilson Sonsini Goodrich & Rosati

(57) ABSTRACT

Aspects of diamond growth on semiconductors are described. Some aspects include deposition of a layer of diamond seeds on a semiconductor-containing layered structure. Some aspects include the deposition of an intermediate layer over the layer of diamond seeds. In some aspects, the intermediate layer is an immobilizing layer to immobilize the diamond seeds. Some aspects include generating synthetic diamond over a surface of a semiconductor-containing layered structure. In some aspects, synthetic diamond is generated over a surface comprising diamond seeds and an intermediate layer. In some aspects, semiconductor-containing layered structure is etched with diamond seeds in place over a surface of the semiconductor-containing layered structure. In some aspects, an interface of a substrate comprises an interface between a layer of diamond seeds and a semiconductor-containing layered structure, an interface (Continued)

between an intermediate layer and the layer of diamond seeds, and an interface between synthetic diamond and the intermediate layer.

18 Claims, 19 Drawing Sheets

Related U.S. Application Data

(60) Provisional application No. 63/129,007, filed on Dec. 22, 2020.

(56) References Cited

U.S. PATENT DOCUMENTS

| | | | | |
|---|---|---|---|---|
| 5,304,461 | A | * | 4/1994 | Inoue .................. H10P 14/6902 |
| | | | | 430/323 |
| 7,595,507 | B2 | | 9/2009 | Francis et al. |
| 8,283,189 | B2 | | 10/2012 | Francis et al. |
| 8,283,672 | B2 | | 10/2012 | Francis et al. |
| 8,945,966 | B2 | | 2/2015 | Francis et al. |
| 9,418,833 | B2 | | 8/2016 | Mollart |
| 9,548,257 | B2 | | 1/2017 | Nasser-Faili |
| 9,679,764 | B2 | | 6/2017 | Nasser-Faili |
| 9,742,445 | B1 | | 8/2017 | Actis et al. |
| 10,128,107 | B1 | | 11/2018 | Cho et al. |
| 10,297,526 | B2 | | 5/2019 | Lowe et al. |
| 10,319,580 | B2 | | 6/2019 | Nasser-Faili et al. |
| 10,446,468 | B2 | | 10/2019 | Lowe et al. |
| 10,699,896 | B2 | | 6/2020 | Nasser-Faili et al. |
| 2006/0113546 | A1 | | 6/2006 | Sung |
| 2006/0175293 | A1 | | 8/2006 | Tachibana et al. |
| 2007/0232074 | A1 | * | 10/2007 | Ravi ...................... C23C 16/27 |
| | | | | 438/758 |
| 2008/0160872 | A1 | | 7/2008 | Sakai et al. |
| 2009/0173950 | A1 | | 7/2009 | West et al. |
| 2010/0105166 | A1 | | 4/2010 | Francis et al. |
| 2010/0314627 | A1 | | 12/2010 | Sung |
| 2014/0110722 | A1 | | 4/2014 | Kub et al. |
| 2014/0332934 | A1 | | 11/2014 | Mollart et al. |
| 2014/0339684 | A1 | | 11/2014 | Mollart |
| 2016/0197027 | A1 | * | 7/2016 | Nasser-Faili ...... H01L 21/02513 |
| | | | | 257/76 |
| 2017/0263448 | A1 | | 9/2017 | Nasser-Faili et al. |
| 2017/0271235 | A1 | | 9/2017 | Lowe et al. |
| 2019/0139857 | A1 | | 5/2019 | Twitchen |
| 2019/0157181 | A1 | | 5/2019 | Hobart et al. |
| 2019/0252288 | A1 | | 8/2019 | Shinagawa et al. |
| 2019/0326162 | A1 | | 10/2019 | Kaplun et al. |
| 2020/0381331 | A1 | * | 12/2020 | Pobedinskas ..... H01L 21/02658 |
| 2021/0057305 | A1 | * | 2/2021 | Yaita ................... H10D 30/475 |
| 2022/0189846 | A1 | | 6/2022 | Francis et al. |
| 2024/0249939 | A1 | * | 7/2024 | Soleiman Zadeh Ardebili .......... |
| | | | | H10P 14/274 |

OTHER PUBLICATIONS

PCT/US2021/064909 International Search Report and Written Opinion dated Apr. 27, 2022.
Toros, et al. Precision micro-mechanical components in single crystal diamond by deep reactive ion etching. Microsystems & nanoengineering 4.1 (2018): 1-8.
Toros, et al. Reactive ion etching of single crystal diamond by inductively coupled plasma: State of the art and catalog of recipes. Diamond and Related Materials Article (2020): 107839.
U.S. Appl. No. 17/556,312 Office Action dated May 23, 2023.
Wide-bandgap semiconductor, Wikipedia, 2007 retrieved from the internet on Aug. 27, 2020 at https://en.wikipedia.org/wiki/Wide-bandgap_semiconductor p. 2 para 4, 6.

* cited by examiner

500

700C

PROVIDING A LAYERED STRUCTURE
711

GENERATE INTERMEDIATE LAYER
715

GENERATE LAYER OF MATERIAL
717

DEVICES HAVING AND METHODS OF FORMING THERMALLY CONDUCTIVE SUBSTRATES

CROSS-REFERENCE

This application is a continuation of PCT Application No. PCT/US2021/064909 filed Dec. 22, 2021, which claims the benefit of U.S. Provisional Application No. 63/129,007, filed Dec. 22, 2020, which is incorporated herein by reference for all purposes.

BACKGROUND

As development of wide-bandgap semiconductor devices continues to evolve, the demand for efficiency increases. Semiconductor devices such as power amplifiers can exhibit improved thermal efficiencies and operating temperatures with improved performance and reliability through the use of wide-bandgap semiconductors. The integration of thermally conductive materials, such as diamond heat-sinks or diamond substrates with wide-bandgap semiconductors has helped drive improvements in thermal efficiency for substrates.

SUMMARY

Challenges arise with integrating such materials while achieving high-thermal conductivity properties at interfaces within the substrates. To improve the thermal efficiencies of wide-bandgap semiconductor devices, particularly for high-power and high-frequency applications, it may be desirable to integrate high-thermal conductivity materials, such as diamond, with semiconductor materials. However, challenges arise in generating thermally conductive interfaces between diamond and semiconductor materials, at least in part, because bonding materials and nucleating materials may decrease interface thermal conductivity. The present disclosure provides devices, systems and methods comprising layered structures and substrates. Some aspects of the present disclosure provide devices, systems and methods that comprise diamond layers generated on wide-bandgap semiconductor materials.

Aspects of the present disclosure may provide at least some of the following benefits: increasing an average value of thermal conductivity of a region of the interface, reduce an average value of thermal boundary resistance of a region of the interface; and/or assist in increasing an average value of adhesion strength (J/m^2) of the material to the structure. Prior methods and semiconductor devices may have been directed to addressing the difficulties of formation of a stable interface between highly conductive materials and semiconductors by using nucleating layers. Further, prior methods may have focused on forming flat or continuous interfaces for the purpose of increasing bonding yield. Methods and systems described herein may use roughened or articulated interfaces to create interlocking surfaces and/or may intentionally roughen the semiconductor surface.

In an aspect, the present disclosure provides semiconductor structure. The semiconductor structure may comprise: a layered structure comprising a wide-bandgap semiconductor material; a plurality of diamond seeds disposed over at least a portion of the layered structure; and an intermediate layer disposed over at least a portion of the plurality of the diamond seeds.

In some embodiments, the structure further comprises a layer of material disposed over at least a portion of the intermediate layer, wherein the layer of material has an average value of thermal conductivity equal to or greater than about 1,000 Watts per meter Kelvin (W/mK). In some embodiments, the layer of material comprises diamond. In some embodiments, the layer of material has a thickness from about 10 micrometers to about 600 micrometers. In some embodiments, an interface between the layered structure and the layer of material comprises at least a portion of the plurality of the diamond seeds. In some embodiments, the interface has an average value of thermal boundary resistance from about 1 meter^2 Kelvin (m^2 K/GW) to about 12 m^2 K/GW. In some embodiments, the interface comprises a material forming a discontinuous layer across a surface of the semiconductor structure. In some embodiments, the interface comprises an articulated interface. In some embodiments, the interface comprises at least a portion of the intermediate layer. In some embodiments, the interface has a thickness greater than about 50 nanometers.

In some embodiments, the structure further comprises a second plurality of diamond seeds disposed over at least a portion of the intermediate layer. In some embodiments, the interface comprises at least a portion of the second plurality of diamond seeds. In some embodiments, the second plurality of diamond seeds has an average diameter from about 5 nanometers to about 60 nanometers. In some embodiments, the average diameter is from about 5 nanometers to about 25 nanometers. In some embodiments, the second plurality of diamond seeds has an average diameter less than an average diameter of the first plurality of diamond seeds. In some embodiments, the second plurality of diamond seeds forms a discontinuous layer across a surface of the intermediate layer. In some embodiments, at least one diamond column from a first diamond seed of the second plurality of diamond seeds and at least one diamond column from a second diamond seed of the second plurality of diamond seeds coalesce at a distance from a surface of the semiconductor structure. In some embodiments, the plurality of diamond seeds has an average value of thermal conductivity less than about 500 Watts per meter Kelvin (W/mK). In some embodiments, the plurality of diamond seeds has an average diameter from about 40 nanometers to about 300 nanometers. In some embodiments, at least a portion of the plurality of diamond seeds is disposed over and in contact with the at least a portion of the layered structure.

In some embodiments, the intermediate layer is configured to attach the plurality of diamond seeds to a surface of the layered structure. In some embodiments, at least a portion of the intermediate layer is disposed over and in contact with at least a portion of the diamond seeds. In some embodiments, at least a portion of the diamond seeds are disposed between the intermediate layer and the layered structure. In some embodiments, the intermediate layer has a thickness greater than about 25 nanometers. In some embodiments, the intermediate layer has a thickness from about 25 nanometers to about 30 nanometers. In some embodiments, the intermediate layer has a thickness greater than about 50 nanometers. In some embodiments, the intermediate layer has an average thickness variance across the surface of the structure greater than about 15 nanometers. In some embodiments, the intermediate layer comprises SiN. In some embodiments, the wide-bandgap semiconductor material comprises a material selected from the group consisting of GaN, AlN, InGaN, InAlN, AlGaN, InGaAlN, Ga2O3, ScAlN, and derivatives or combinations thereof.

In another aspect, the present disclosure provides a semiconductor structure. The semiconductor structure may comprise: a layered structure comprising a wide-bandgap semiconductor material; a plurality of diamond seeds disposed over at least a portion of the layered structure; and a layer of material disposed over at least a portion of the plurality of diamond seeds, wherein the layer of material has an average value of thermal conductivity equal to or greater than about 1,000 Watts per meter Kelvin (W/mK), wherein an interface between the layered structure and the layer of material comprises an articulated interface.

In some embodiments, the structure further comprises an intermediate layer disposed over at least a portion of the plurality of the diamond seeds. In some embodiments, the intermediate layer is configured to attach the plurality of diamond seeds to a surface of the layered structure. In some embodiments, at least a portion of the intermediate is disposed over and in contact with at least a portion of the diamond seeds. In some embodiments, at least a portion of the diamond seeds are disposed between the intermediate layer and the layered structure. In some embodiments, the intermediate layer has a thickness greater than about 25 nanometers. In some embodiments, the intermediate layer has a thickness from about 25 nanometers to about 30 nanometers. In some embodiments, the intermediate layer has a thickness greater than about 50 nanometers. In some embodiments, the intermediate layer has an average thickness variance across the surface of the structure greater than about 15 nanometers. In some embodiments, the intermediate layer comprises SiN.

In some embodiments, the articulated interface comprises the plurality of the diamond seeds. In some embodiments, the articulated interface comprises an average peak to trough distance of greater than about 10 nm. In some embodiments, the articulated interface comprises an average peak to trough distance of greater than about 50 nm. In some embodiments, the articulated the interface has an average value of thermal boundary resistance from about 1 meter$^2$ Kelvin (m$^2$ K/GW) to about 12 m$^2$ K/GW. In some embodiments, the layer of material comprises diamond. In some embodiments, the layer of material has a thickness from about 10 micrometers to about 600 micrometers. In some embodiments, the interface comprises a material forming a discontinuous layer across a surface of the semiconductor structure. In some embodiments, the interface comprises at least a portion of the intermediate layer.

In some embodiments, the semiconductor structure further comprises a second plurality of diamond seeds disposed over at least a portion of the intermediate layer. In some embodiments, the interface comprises at least a portion of the second plurality of diamond seeds. In some embodiments, the second plurality of diamond seeds has an average diameter from about 5 nanometers to about 60 nanometers. In some embodiments, the average diameter is from about 5 nanometers to about 25 nanometers. In some embodiments, the second plurality of diamond seeds has an average diameter less than an average diameter of the first plurality of diamond seeds. In some embodiments, the second plurality of diamond seeds forms a discontinuous layer across a surface of the intermediate layer. In some embodiments, at least one diamond column from a first diamond seed of the second plurality of diamond seeds and at least one diamond column from a second diamond seed of the second plurality of diamond seeds coalesce at a distance from a surface of the semiconductor structure. In some embodiments, the plurality of diamond seeds has an average value of thermal conductivity less than about 500 Watts per meter Kelvin (W/mK). In some embodiments, the plurality of diamond seeds has an average diameter from about 40 nanometers to about 300 nanometers. In some embodiments, at least a portion of the plurality of diamond seeds is disposed over and in contact with the at least a portion of the layered structure. In some embodiments, the wide-bandgap semiconductor material comprises a material selected from the group consisting of GaN, AlN, InGaN, InAlN, AlGaN, InGaAlN, Ga2O3, ScAlN, and derivatives or combinations thereof.

In another aspect, the present disclosure provides a semiconductor structure. The semiconductor structure may comprise: a layered structure comprising a wide-bandgap semiconductor material; a first plurality of diamond seeds disposed over at least a portion of the layered structure; a second plurality of diamond seeds disposed over at least a portion of the first plurality, wherein the second plurality of diamond seeds comprises a smaller average diameter than the first plurality; and a layer of material disposed over at least a portion of the first plurality and the second plurality of diamond seeds, wherein the layer of material has an average value of thermal conductivity equal to or greater than about 1,000 Watts per meter Kelvin (W/mK).

In some embodiments, the semiconductor structure further comprises an intermediate layer disposed between the first plurality and the second plurality. In some embodiments, the intermediate layer is configured to attach the plurality of diamond seeds to a surface of the layered structure. In some embodiments, at least a portion of the intermediate is disposed over and in contact with at least a portion of the diamond seeds. In some embodiments, at least a portion of the diamond seeds are disposed between the intermediate layer and the layered structure. In some embodiments, the intermediate layer has a thickness greater than about 25 nanometers. In some embodiments, the intermediate layer has a thickness from about 25 nanometers to about 30 nanometers. In some embodiments, the intermediate layer has a thickness greater than about 50 nanometers. In some embodiments, the intermediate layer has an average thickness variance across the surface of the structure greater than about 15 nanometers. In some embodiments, the intermediate layer comprises SiN.

In some embodiments, the interface comprises at least a portion of the second plurality of diamond seeds. In some embodiments, the second plurality of diamond seeds has an average diameter from about 5 nanometers to about 60 nanometers. In some embodiments, the average diameter is from about 5 nanometers to about 25 nanometers. In some embodiments, the second plurality of diamond seeds has an average diameter less than an average diameter of the first plurality of diamond seeds. In some embodiments, the second plurality of diamond seeds forms a discontinuous layer across a surface of the intermediate layer. In some embodiments, at least one diamond column from a first diamond seed of the second plurality of diamond seeds and at least one diamond column from a second diamond seed of the second plurality of diamond seeds coalesce at a distance from a surface of the semiconductor structure. In some embodiments, the layer of material comprises diamond. In some embodiments, the layer of material has a thickness from about 10 micrometers to about 600 micrometers.

In some embodiments, an interface between the layered structure and the layer of material comprises at least a portion of the plurality of the diamond seeds. In some embodiments, the interface has an average value of thermal boundary resistance from about 1 meter$^2$ Kelvin (m$^2$ K/GW) to about 12 m$^2$ K/GW. In some embodiments, the interface comprises a material forming a discontinuous layer across a surface of the semiconductor structure. In some embodiments, the interface comprises an articulated interface. In some embodiments, the interface comprises at least a portion of the intermediate layer. In some embodiments, the interface has a thickness greater than about 50 nanometers.

In another aspect, the present disclosure provides a semiconductor structure. The structure may comprise: a layered structure comprising a wide-bandgap semiconductor material, wherein the layered structure comprises a roughened surface; a plurality of diamond seeds disposed over and in contact with the roughened surface of at least a portion of the layered structure; and a layer of material disposed over at least a portion of the plurality of diamond seeds, wherein the layer of material has an average value of thermal conductivity equal to or greater than about 1,000 Watts per meter Kelvin (W/mK).

In some embodiments, the layer of material comprises diamond. In some embodiments, the layer of material has a thickness from about 10 micrometers to about 600 micrometers. In some embodiments, an interface between the layered structure and the layer of material comprises at least a portion of the plurality of the diamond seeds. In some embodiments, the interface has an average value of thermal boundary resistance from about 1 meter^2 Kelvin (m^2 K/GW) to about 12 m^2 K/GW. In some embodiments, the interface comprises a material forming a discontinuous layer across a surface of the semiconductor structure. In some embodiments, the interface comprises an articulated interface. In some embodiments, the interface comprises at least a portion of the intermediate layer. In some embodiments, the interface has a thickness greater than about 50 nanometers.

In some embodiments, the structure further comprises an intermediate layer disposed over at least a portion of the plurality of the diamond seeds. In some embodiments, the structure further comprises a second plurality of diamond seeds disposed over at least a portion of the intermediate layer. In some embodiments, the interface comprises at least a portion of the second plurality of diamond seeds. In some embodiments, the second plurality of diamond seeds has an average diameter from about 5 nanometers to about 60 nanometers. In some embodiments, the average diameter is from about 5 nanometers to about 25 nanometers. In some embodiments, the second plurality of diamond seeds has an average diameter less than an average diameter of the first plurality of diamond seeds. In some embodiments, the second plurality of diamond seeds forms a discontinuous layer across a surface of the intermediate layer. In some embodiments, at least one diamond column from a first diamond seed of the second plurality of diamond seeds and at least one diamond column from a second diamond seed of the second plurality of diamond seeds coalesce at a distance from a surface of the semiconductor structure.

In some embodiments, the plurality of diamond seeds has an average value of thermal conductivity less than about 500 Watts per meter Kelvin (W/mK). In some embodiments, the plurality of diamond seeds has an average diameter from about 40 nanometers to about 300 nanometers. In some embodiments, at least a portion of the plurality of diamond seeds is disposed over and in contact with the at least a portion of the layered structure. In some embodiments, the intermediate layer is configured to attach the plurality of diamond seeds to a surface of the layered structure. In some embodiments, at least a portion of the intermediate layer is disposed over and in contact with at least a portion of the diamond seeds. In some embodiments, at least a portion of the diamond seeds are disposed between the intermediate layer and the layered structure.

In some embodiments, the intermediate layer has a thickness greater than about 25 nanometers. In some embodiments, the intermediate layer has a thickness from about 25 nanometers to about 30 nanometers. In some embodiments, the intermediate layer has a thickness greater than about 50 nanometers. In some embodiments, the intermediate layer has an average thickness variance across the surface of the structure greater than about 15 nanometers. In some embodiments, the intermediate layer comprises SiN. In some embodiments, the wide-bandgap semiconductor material comprises a material selected from the group consisting of GaN, AlN, InGaN, InAlN, AlGaN, InGaAlN, Ga2O3, ScAlN, and derivatives or combinations thereof.

In another aspect, the present disclosure provides a device for transmitting or receiving signals, comprising a chip comprising the semiconductor structure of any aspect or embodiment herein. In some embodiments, the device further comprises a transmitting or receiving unit configured to be operatively coupled to the chip, which transmitting or receiving unit is configured to transmit or receive the signals. In some embodiments, the transmitting or receiving unit comprises one or more antennas. In some embodiments, the chip is a radiofrequency amplifier chip.

In another aspect, the present disclosure provides a satellite comprising the device of any aspect or embodiment herein. In some embodiments, the satellite is a cubesat. In some embodiments, the satellite weighs at least about 10 kilograms (kg).

In another aspect, the present disclosure provides a method of forming a semiconductor structure. The method may comprise: providing a layered structure comprising a wide-bandgap semiconductor material; generating an intermediate layer over at least a portion of the layered structure; and generating a layer of material over at least a portion of the intermediate layer, wherein the layer of material has an average value of thermal conductivity equal to or greater than about 1,000 Watts per meter Kelvin (W/mK).

In some embodiments, the method further comprises, prior to generating the intermediate layer: depositing a plurality of diamond seeds over at least a portion of a surface of the layered structure. In some embodiments, the method further comprises, prior to generating the intermediate layer: depositing a plurality of diamond seeds over at least a portion of a surface of the layered structure; and etching at least a portion of the layered structure to form one or more trenches in the layered structure. In some embodiments, the method further comprises, prior to generating the intermediate layer: depositing an etch mask over at least a portion of a surface of the layered structure; and etching at least a portion of the layered structure to form one or more trenches in the layered structure. In some embodiments, the method further comprises, prior to generating the intermediate layer: depositing an etch mask over at least a portion of a surface of the layered structure; and etching at least a portion of the layered structure to form one or more trenches in the layered structure, wherein at least a portion of a plurality of diamond seeds are deposited in the one or more trenches.

In some embodiments, the method further comprises, prior to generating the layer of material, depositing a second plurality of diamond seeds over at least a portion of a surface of the intermediate layer. In some embodiments, each of the plurality of diamond seeds has an average diameter from about 40 nanometers to about 300 nanometers. In some embodiments, the intermediate layer has a thickness greater than about 25 nanometers and is configured to attach the plurality of diamond seeds to a surface of the layered structure. In some embodiments, the intermediate layer has a thickness variance across the surface of the structure greater than about 15 nanometers. In some embodiments, the layer of material comprises diamond. In some embodiments, the generating the layer of diamond comprises forming a first diamond column from a first diamond seed of the second plurality of diamond seeds and forming a second diamond column from a second diamond seed of the second plurality of diamond seeds to coalesce the first diamond column and the second diamond column at a distance from a surface of the semiconductor structure. In some embodiments, each of the second plurality of diamond seeds has an average diameter from about 5 nanometers to about 60 nanometers. In some embodiments, the intermediate layer comprises SiN.

In another aspect, the present disclosure provides a method of forming a semiconductor structure. The method may comprise: providing a layered structure comprising a wide-bandgap semiconductor material; depositing an etch mask over at least a portion of a surface of the layered structure; etching at least a portion of the layered structure to form one or more trenches in the layered structure; and generating a layer of material over at least a portion of the intermediate layer, wherein the layer of material has an average value of thermal conductivity equal to or greater than about 1,000 Watts per meter Kelvin (W/mK).

In some embodiments, the method further comprises depositing a plurality of diamond seeds over at least a portion of a surface of the layered structure. In some embodiments, at least a portion of a plurality of diamond seeds are deposited in the one or more trenches.

In another aspect, the present disclosure provides: a method of forming a semiconductor structure, the method comprising: providing a layered structure comprising a wide-bandgap semiconductor material; depositing a first plurality of diamond seeds over at least a portion of a surface of the layered structure; depositing a second plurality of diamond seeds over at least a portion of the first plurality, wherein the second plurality of diamond seeds comprises a smaller average diameter than the first plurality; and generating a layer of material over at least a portion of the intermediate layer, wherein the layer of material has an average value of thermal conductivity equal to or greater than about 1,000 Watts per meter Kelvin (W/mK).

Additional aspects and advantages of the present disclosure will become readily apparent to those skilled in this art from the following detailed description, wherein only illustrative embodiments of the present disclosure are shown and described. As will be realized, the present disclosure is capable of other and different embodiments, and its several details are capable of modifications in various obvious respects, all without departing from the disclosure. Accordingly, the drawings and description are to be regarded as illustrative in nature, and not as restrictive.

INCORPORATION BY REFERENCE

All publications, patents, and patent applications mentioned in this specification are herein incorporated by reference to the same extent as if each individual publication, patent, or patent application was specifically and individually indicated to be incorporated by reference. To the extent publications and patents or patent applications incorporated by reference contradict the disclosure contained in the specification, the specification is intended to supersede and/or take precedence over any such contradictory material.

BRIEF DESCRIPTION OF THE DRAWINGS

The novel features of the invention are set forth with particularity in the appended claims. A better understanding of the features and advantages of the present invention will be obtained by reference to the following detailed description that sets forth illustrative embodiments, in which various principles of the invention are utilized, and the accompanying drawings or figures (also "FIG." and "FIGs." herein), of which:

DETAILED DESCRIPTION

Figures 1, 2:
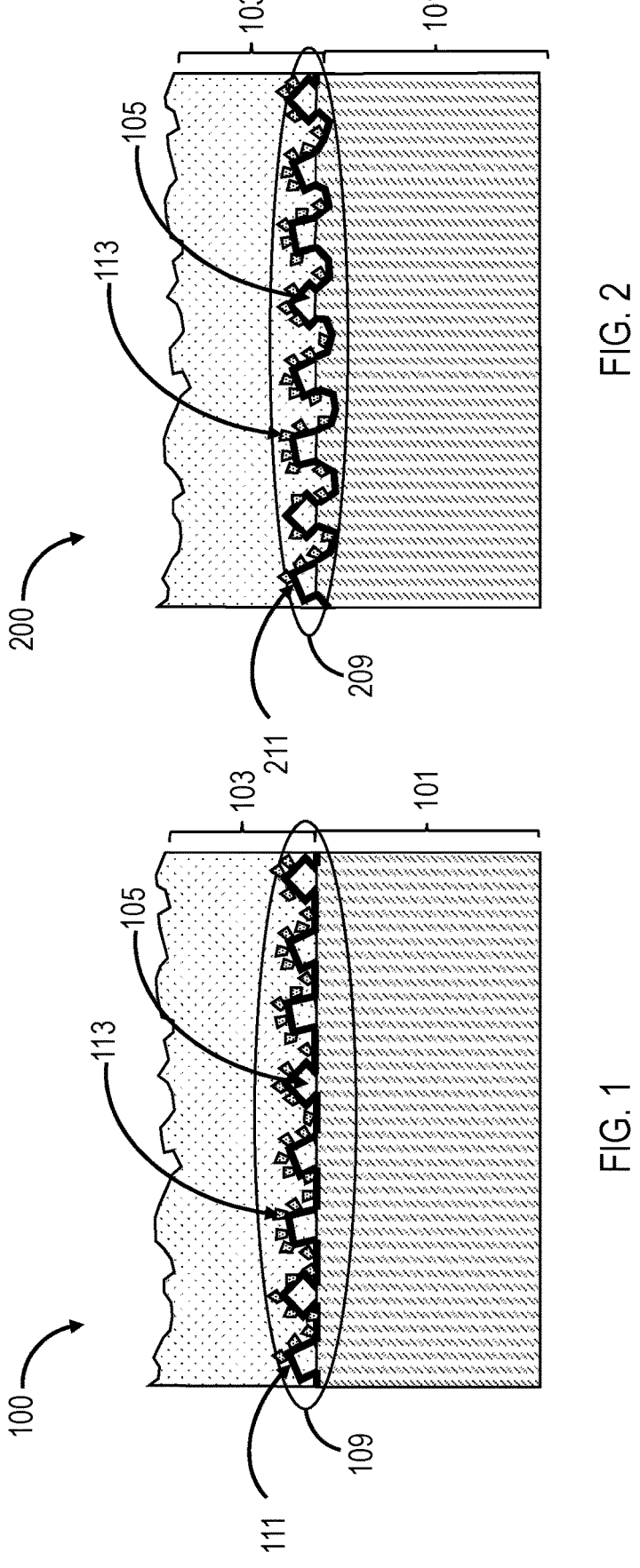
FIG. 1 illustrates a cross-sectional view of an example substrate, in accordance with some embodiments disclosed herein.
FIG. 2 illustrates a cross-sectional view of an example substrate, in accordance with some embodiments disclosed herein.

While various embodiments of the invention have been shown and described herein, it will be obvious to those skilled in the art that such embodiments are provided by way of example only. Numerous variations, changes, and substitutions may occur to those skilled in the art without departing from the invention. It should be understood that various alternatives to the embodiments of the invention described herein may be employed.

It shall be understood that different aspects of the invention can be appreciated or modified individually, collectively, or in combination with each other. Where values are described as ranges, it will be understood that such disclosure includes the disclosure of all possible sub-ranges within such ranges, as well as specific numerical values that fall within such ranges irrespective of whether a specific numerical value or specific sub-range is expressly stated.

The present disclosure provides devices, systems, and methods comprising layered structures and substrates having improved thermal efficiencies. Such devices may include one or more transistors. Devices may include integrated circuits, power amplifiers and radio transmitters, for use in high-frequency applications, for example, millimeter wave (mmWave) applications. Such devices may provide improved performance at X-band frequency ranges (e.g., 8-12 GHz), K-band frequency ranges (e.g., 17-20 GHz, 37-40 GHz), V-band frequency ranges (e.g., 40-75 GHz), W-band frequency ranges (e.g., 75-110 GHz), G-band frequency ranges (e.g., 110-300 GHz), E-band frequency ranges (e.g., 60-90 GHz), or other suitable frequency ranges. Aspects of the present disclosure may be applicable to other types of electronic and optoelectronic devices, for example, microwave diodes and lasers.

Aspects of the present disclosure provide methods of generating diamond on semiconductor-containing materials. Some aspects provide methods of manufacturing semiconductor substrates. Some aspects provide devices comprising such semiconductor substrates. Disclosed are methods of growing diamond on semiconductor-containing materials to achieve improved thermally conductive interfaces. Aspects may also include growing diamond directly on semiconductor-containing materials without the use of SAD and photoresist materials (or other methods and materials) for seeding diamond particles.

Aspects of the present disclosure provide methods of generating diamond directly on semiconductor-containing materials to achieve thermal extraction without introducing electrically conductive regions on or within the semiconductor material. Some examples may include depositing one or more layers of diamond seeds on wide-bandgap semiconductor materials. Some examples may include generating one or more intermediate layers over the layer of diamond seeds. An intermediate layer may assist in anchoring or immobilizing the layer of diamond seeds. Some examples may include etching the wide-bandgap semiconductor materials. Such etching may follow a deposition of the layer of diamond seeds. Etching may be used, at least in part, to form an articulated interface. Etching may be used, at least in part, to form a roughened surface, for example, a roughened surface of a layered structure. An articulated interface may include a roughened surface of a layered structure. Some examples may include generating diamond substrates over a surface of the wide-bandgap semiconductors. Some examples include generating the diamond substrates over a layer of the diamond seeds. Some examples include generating the diamond substrates over the intermediate layer.

Unless otherwise defined, all technical terms used herein have the same meaning as commonly understood by one of ordinary skill in the art to which this invention belongs. As used in this specification and the appended claims, the singular forms "a," "an," and "the" include plural references unless the context clearly dictates otherwise. Any reference to "or" herein is intended to encompass "and/or" unless otherwise stated.

The term "wide-bandgap" and "wide-gap" (or variations thereof), as used herein in the context of semiconductor technology, generally refer to electronic and/or optoelectronic devices and manufacturing technologies based on wide-bandgap semiconductors. A wide-bandgap semiconductor may have a bandgap in a range of 2-4 electronvolt (eV), for example. A wide-bandgap semiconductor may have a bandgap in a range greater than about 3.4 eV. A wide-bandgap semiconductor can comprise, for example, in relation to the Periodic Table of the Elements: (a) semiconductors comprising a bond between nitrogen (N) and at least one Group III element, (b) semiconductors comprising a bond between carbon (C) and at least one Group IV element, or (c) semiconductors comprising a bond between oxygen (O) and at least one Group II element. A wide-bandgap semiconductor, for example, may comprise one or more materials including gallium, aluminum, indium, boron, scandium, nitrogen, and derivatives thereof. In some examples, a wide-bandgap semiconductor may include gallium nitride (GaN), aluminum nitride (AlN), indium gallium nitride (InGaN), indium aluminum nitride (InAlN), aluminum gallium nitride (AlGaN), indium gallium aluminum nitride (InGaAlN), gallium oxide ($Ga_2O_3$) or derivatives thereof. Such materials may improve performance efficiency in high-power microwave devices, which can exhibit electron mobilities, breakdown voltages, and thermal conductivities that exceed other semiconductor materials, such as gallium arsenide (GaAs), indium phosphide (InP), or silicon.

The term "thermal budget," as used herein, generally refers to an assessment of temperature dissipation from one or more components to an environment. For example, a thermal budget may define an amount of thermal energy transferred from a heat source (e.g., active layers of a device) to a surrounding environment. The active layers of a semiconductor device may be several micrometers thick and may be disposed adjacent to mechanical carriers or substrates.

The term "substrate," as used herein, generally refers to any substance upon which a layered structure is deposited. The substrate may comprise a foundation for the fabrication of electronic devices, such as transistors, diodes, and integrated circuits. The substrate may comprise a solid material such as a semiconductor or an insulator. The substrate may comprise a wide-bandgap semiconductor. The substrate may comprise a carbon-containing material, such as diamond, synthetic diamond, diamond-like carbon, graphene, diamond nanoparticles or Nano diamond. The substrate material may be single crystalline, poly crystalline or amorphous.

Substrate materials may comprise, for example, carbon, aluminum, gallium, silicon, germanium, arsenic, thallium, cadmium, tellurium, selenium, or alloy or allotrope thereof, or an oxide or nitride thereof. The substrate may include one or more chemical dopants, such as nitrogen, phosphorous, boron or indium.

Substrate materials may comprise one or more of, for example, diamond, synthetic diamond, silicon (Si), silicon dioxide (SiO2), silicon carbide (SiC), aluminum oxide (Al2O¬3), sapphire, aluminum nitride (AlN), scandium aluminum nitride (ScAlN), germanium, gallium arsenide, gallium nitride (GaN), or indium phosphide (InP), indium nitride (InN), aluminum gallium nitride (AlGaN), indium gallium nitride (InGaN), indium aluminum nitride (InAlN), zinc oxide (ZnO), for example. The substrate may include a material having a thermal conductivity equal to or greater than about 1,000 Watts per meter Kelvin (W/mK) in at least a single dimension (e.g., vertical dimension, horizontal dimension).

The term "single-crystal," as used herein, generally refer to a material having one crystal or having a translational symmetry. The term "polycrystalline" generally refers to a material having more than one crystal domain or orientation. A polycrystalline material may exhibit more than one crystal structure under low energy electron diffraction (LEED) microscopy. The term "amorphous" generally refers to a material having no real or apparent crystalline form. An amorphous material may not exhibit any long-range crystal structure under LEED.

Active layers of a semiconductor device may be epitaxially grown on a substrate. In some cases, the substrate may be of the same family of materials as the active layers of the electronic device. Electronic materials for device fabrication may be realized by attaching the active layers to substrates comprising materials having crystalline structures and material combinations different from the active layer. Examples of ways to attach semiconductors to substrates having different crystal structures can include direct-bonding or direct growth using transition layer(s) to bridge different lattice structures. Alternatives to bonding and die-attachment may include the use of selective area deposition (SAD).

The substrate may have various functions, for example, (i) mechanical support; (ii) electrical conductivity that can be used to connect the active layers to the bottom of the chip; (iii) electrical isolation with low dielectric losses that can be used in high-frequency devices and surface waveguides where electric fields penetrate into the substrate; and (iv) high thermal conductivity with or without associated electrical conductivity.

The term "layered structure," as used herein, generally refers to structures created from layered materials of varying properties. A layered structure may comprise layers of one or more materials that may have the same or varying semiconductor properties. Individual layers may be single crystalline, polycrystalline, or amorphous. Electronic and optoelectronic devices manufactured out of layers of different semiconductor properties may be made by different growth techniques. In some cases, these growth techniques may allow for controlled growth of individual layers. In some cases, the layers may be referred to as "epitaxial layers" or "epilayers." Each layer may be of a thickness varying from sub-nanometer (nm) to tens of microns (μm). Non-limiting examples of manufacturing techniques include molecular beam epitaxy (MBE), vapor deposition (e.g., chemical vapor deposition (CVD), physical vapor deposition), atomic layer deposition (ALD), organo-metallic vapor-phase epitaxy, and liquid phase epitaxy.

Epitaxial layers may comprise, for example, boron, aluminum, gallium, indium, thallium, carbon, silicon, germanium, tin, lead, nitrogen, phosphorous, arsenic, antimony, bismuth, oxygen, sulfur, selenium, tellurium, beryllium, magnesium, calcium, zinc, cadmium, scandium, and alloys and allotropes thereof or an oxide or nitride thereof. Epitaxial layers may comprise wide-bandgap semiconductor materials. Epitaxial layers may comprise a material comprising: (i) a bond between at least one Group III element and at least one Group V element; (ii) a bond between nitrogen and at least one Group III element; (iii) a bond between carbon and at least one group IV element; or (iv) a bond between oxygen and at least one group II element.

Epitaxial layers may comprise, for example, gallium nitride (GaN), aluminum nitride (AlN), indium nitride (InN), aluminum gallium nitride (AlGaN), indium gallium nitride (InGaN), indium aluminum nitride (InAlN), zinc oxide (ZnO), silicon carbide (SiC), and diamond. Any such materials may be single-crystalline, polycrystalline, or amorphous.

The term "chip," as used herein generally refers to an active electronic or optoelectronic device, which may be disposed on a substrate. A chip may comprise one or more active layers disposed a substrate. The chip may comprise a layered structure. The chip may comprise one or more transistors (e.g., field-effect transistor, bipolar transistor). A transistor may be a high-electron-mobility transistor. The chip may comprise an integrated circuit, such as a monolithic microwave integrated circuit (MMIC). The chip may perform functions such as mixing, power amplification, low noise amplification, and switching.

The term "transistor," as used herein, generally refers to an electrical device which can act as a switch and/or an amplifier. A transistor may be a part of a digital circuit. A digital circuit may comprise a plurality of transistors. A transistor may comprise one or more contacts, a layered structure, and a substrate. A transistor may be a part of a computing device. A transistor may be a portion of a logic circuit or a logic gate. A transistor may be a semiconductor device. The term "field-effect transistor" (FET) as used herein, generally refers to a transistor which uses an electric field to control the operation of a device having the transistor. An electric field may be used to control the flow of current between two contacts or terminals in the device such as a source contact and a drain contact.

The term "high-electron-mobility transistor" (HEMT), as used herein, generally refers to a field-effect transistor comprising a heterojunction. A high-electron-mobility transistor may be alternatively referred to as a heterostructure field effect transistor. The term "heterojunction," as used herein, may refer to the interface between any two solid-state materials of differing material properties. In some examples, these may include any two semiconductors, any two crystalline forms (e.g., amorphous, polycrystalline) of the same semiconductor, any two semiconductors comprising the same element but with varying amounts of those elements, any two semiconductors with varying dopant level, etc. The two materials may have unequal band gaps. The two materials may have a band offset. The two materials forming the heterojunction may be referred to as a "heterostructure." In some examples, an interface between a buffer layer and a barrier layer may form a heterojunction.

The term "Schottky contact," as used herein, generally refers to a metal-semiconductor interface with a non-zero contact resistance, measured relative to the resistance of the semiconductor. The contact may comprise an energetic barrier between states of the semiconductor and states of the metal which barrier may be non-zero. The contact may be a rectifying contact, e.g., a Schottky barrier. In some examples, devices may include one or more dielectric or insulating material layers, for example, under a gate contact. Such devices may comprise Metal-Insulator-Semiconductor Field Effect Transistors ("MISFIT"s).

The term "interface," as used herein, generally refers to an area or region comprising a surface forming a common boundary between two different materials, for example, materials having differing crystalline structures, differing material combinations, differing material properties. In some cases, the term "interface" can refer to a location where two different materials come into contact with one another. The term "interface" can also refer to the atoms of a first material combining with the atoms of a second material at a location or at a boundary, for example, without the presence of atoms of a third material. An interface may be an area or region comprising a surface forming a common boundary between semiconductor and diamond, such as when a surface is irregular, or the surface itself. An interface can be a location where diamond atoms contact atoms of a wide-bandgap semiconductor. A compound substrate of the present disclosure may include a single interface. In some examples, such a compound substrate may not include more than one interface.

The term "etching," as used herein, generally refers to a process of removing (e.g., via chemical or gas etchant) material from a wafer or substrate. A portion of the substrate may be protected from etching by the use of an "etch mask," which may comprise material that resists etching. Etch mask materials may include, for example, photoresist, silicon nitride, silicon dioxide, aluminum, titanium, or other materials. Etching may include wet etching (e.g., using liquid chemicals). Etching may include dry etching (e.g., using a reactive plasma or gas), also known as plasma etching. Plasma etching may, for example, include microwave plasma etching, reactive-ion etching (RIE), ion-assisted chemical vapor etching, inductively coupled plasma (ICP), transformer-coupled plasma (TCP) or capacitively coupled plasma (CCP). A plasma etcher, or etching tool, may be used to plasma etch a substrate. An etching tool may produce a plasma source (e.g., etching species) from a gas (e.g., boron trichloride/chlorine gas, fluorine-bearing gas) and an electric field (e.g., RF, microwave, DC). An etching species may comprise positively charged or negatively charged ions. Etching quality may be influenced in part by parameters including selectivity, uniformity, directionality, plasma density and etching rate. Plasma density may be determined by plasma process parameters such as plasma etch power, process pressure and gas flow rate.

The term "intermediate layer," as used herein, generally refers to a material layer disposed between two or more material layers, for example, between two layers of materials having similar or varying properties. Intermediate layers may comprise single crystalline, polycrystalline, or amorphous materials. Intermediate layers may comprise wide-bandgap semiconductors, as described herein. Intermediate layers may comprise carbon-containing materials as described herein. Individual layers surrounding an intermediate layer may comprise materials having different lattice-constants or different lattice structures. Individual layers surrounding an intermediate layer may comprise materials having different thermal conductivities and/or different sheet resistivities. An intermediate layer may comprise an interface or interface layer between two material layers. An intermediate layer may have a thickness from about sub-nanometer to tens of microns.

An intermediate layer may comprise an anchoring layer. An intermediate layer may comprise an immobilizing layer. An intermediate layer may comprise a tacking layer. An anchoring layer may assist in anchoring diamond seeds to a material layer, for example, anchoring a layer of diamond seeds to a semiconductor-containing material layer.

An immobilizing layer may assist in immobilizing a layer of diamond seeds over a surface of a semiconductor-containing material layer. A tacking layer may assist in tacking (e.g., attaching) a layer of diamond seeds to a surface of a semiconductor-containing material layer. In some examples, the diamond seeds may be immobilized, anchored, or tacked to a semiconductor surface, in part, through Van der Waals bonding between the diamond seeds and the semiconductor surface. In some examples, the diamond seeds may be immobilized, anchored, or tacked to a semiconductor surface, in part, through adhesion of the intermediate layer to the semiconductor surface.

At least in part by anchoring a layer of diamond seeds to a semiconductor-containing material surface, immobilizing the diamond seeds on the surface or by tacking the diamond seeds to the surface, the diamond seeds are brought close to or in direct contact with the semiconductor-containing material such that at least a portion of the layer of the diamond seeds forms an interface with the semiconductor-containing material. The interface may be a single interface. The interface may include at least a portion of the layer of diamond seeds. The interface may include at least a portion of the semiconductor-containing material. Thermal conductivity of the interface may be improved at least in part by anchoring the layer of diamond seeds to the surface of the semiconductor-containing material, immobilizing the diamond seeds on the surface or by tacking the diamond seeds to the surface.

An intermediate layer may comprise a transition layer between two material layers or two substrates. In some examples, a transition layer may bridge a first lattice structure (e.g., first lattice constant) of a first material layer to a second lattice structure (e.g., second lattice constant) of a second material layer, for example, within a layered semiconductor structure. One or more transition layers may be used to accommodate for a change in the lattice constants and help absorb dislocations between two material layers or substrates.

An intermediate layer may comprise a nucleation layer. The term "nucleation layer" or "nucleating layer," as used herein, generally refers to a material layer that assists in starting the growth or formation of another layer of material or stoichiometry. Nucleating layer materials can include semiconductors, for example, wide-bandgap semiconductors. Nucleating materials can include silicon, silicon nitride (SiN), silicon carbide (SiC) or other materials that may aid in the nucleation of synthetic diamond. Nucleating materials can include, for example, InGaN, InAlN, AlN, ScAlN or derivatives thereof. Nucleating layer materials can assist in preventing etching or damage to an underlying semiconductor material or substrate. Nucleating materials can be amorphous or polycrystalline. The presence of a nucleating layer may create multiple interfaces between a layered semiconductor structure and a substrate. Multiple interfaces can include, for example, (i) a first interface between a diamond substrate and a nucleating layer and (ii) a second interface between the nucleating layer and a layered semiconductor structure.

Nucleating layer(s) may be disposed between two material layers or substrates, such as two material layers having similar or varying properties. A nucleating layer may have similar properties to a material to which the nucleating layer assists in the growth of. Nucleating layers may be used in nucleating diamond on semiconductor-containing structures. Nucleating layers may be protective layers that protect such structures from damage. Such structures may include one or more nucleating layers disposed between a semiconductor-containing material and diamond. A nucleating layer may be an individual layer that is independent from a semiconductor-containing structure and may be disposed on a surface of such structure. In some cases, a nucleating layer may be nucleation material that is added to a final stage of growth of such structure (e.g., final stage of epitaxial growth), in which case the nucleation material may not be an independent layer but may be integrated into the structure near a surface (e.g., top surface). A diamond growth process can include a nucleation phase in which a nucleating layer and a set of diamond-growth conditions can enhance diamond nucleation on a host substrate. Diamond-growth conditions can include conditions within a vacuum chamber, for example, in the case of vapor deposition (e.g., CVD). In some cases, layered structures, for example, semiconductor structures described herein do not comprise a nucleating layer. In some cases, layered structures, for example, semiconductor structures described herein comprise an intermediate layer which substantially does not function as a nucleating layer.

Heat removal systems for devices such as power amplifiers may be large in comparison with a heat source and may limit performance. Diamond heat-sinks, heat-spreaders, and other diamond plates may be useful in spreading heat below a semiconductor device for thermal management. A diamond heat-sink may be a thermal component to which a device can be attached, wherein the diamond heat-sink assists in spreading heat generated by the device. In some cases, diamond substrates may differ from diamond heat-sinks, heat-spreaders, or plates. For example, a diamond substrate may comprise a substrate on which active electronic device layers are disposed to form a device (e.g., die, chip).

Depositing diamond seeds onto substrate materials may include ultrasonic seeding, a process that can include placing a substrate in an ultrasonic seeding solution or bath (e.g., containing diamond particles) and agitating the bath until the diamond particles adhere to the substrate. Manufacturing compound semiconductor substrates that include synthetic diamond presents certain challenges. For example, diamond deposition is a high-temperature process often requiring temperatures greater than about 600° C. (e.g., about 800° C.) and the use of highly reactive gases such as atomic hydrogen. Such temperatures and reactive gases (e.g., H2) may be incompatible with many semiconductors and may damage or cause defects to a semiconductor material, resulting in performance degradation of semiconductor structures and devices, among other drawbacks. Additionally, differing lattice constants between diamond and semiconductors may present challenges to integrating diamond with semiconductor devices.

Damage or defects can include material decomposition and etching (e.g., etching by H+ formed from H2 during the diamond synthesis process). For example, hydrogen can etch a semiconductor surface, such as a GaN surface, during diamond growth causing a decrease in nitrogen and a build-up of metallic Ga on the GaN surface. Defects or damage may be measured and quantified. For example, growing diamond directly on a semiconductor material may result in a measurable interface property or surface property. A type of measurable interface property or surface property may vary based on a location on or within a compound semiconductor substrate. In some examples, the presence of metallic Ga on a GaN surface may indicate damage from hydrogen etching during diamond growth.

Such interface property or surface property can include, for example, charge density (carriers/$cm^2$) (e.g., charge carrier density, carrier concentration, surface charge density, volume charge density, length charge density), effective thermal boundary resistance ($m^2K/GW$) (e.g., of a thermal boundary), thermal conductivity (W/mK), electrical conductivity (S/m), electrical resistivity (C·m), or defect density (defects/unit area). Surface charge density ($\sigma$) may be defined as the quantity of charge per unit area, at any point on a surface charge distribution on a two-dimensional surface, typically measured in coulombs per square meter ($C·m^{-2}$). Volume charge density ($\rho$) may be defined as the quantity of charge per unit volume, at any point in a volume, typically measured in coulombs per cubic meter ($C·m^{-3}$). Thermal boundary resistance (e.g., interfacial thermal resistance) may be defined as a measure of resistance to thermal energy flow at a boundary or interface (e.g., between two materials), typically caused by differences in material properties of two interfaced materials. Thermal boundary resistance can occur through energy scattering by charge carriers at a material interface. Thermal conductivity, or the measurement of the ability of a material to conduct heat, may be measured and quantified as an average value.

An interface property may be measured, for example, by capacitance-voltage (C-V) testing, four-point probe conductivity measurement, sheet resistance measurement tools, non-contact sheet resistance measurements, Eddy current measurement, laser flash, Fourier Transform Infra-Red (FTIR) analysis, Time Domain Thermal Reflectance (TDTR). An interface property may be measured at a temperature of about 23° C. An interface property may be measured by scanning electron microscopy (SEM) or by transmission electron microscopy (TEM).

Some alternatives to bonding and die-attachment may also address the concern of damage to a semiconductor material during diamond growth. Some alternatives may include selective area deposition (SAD) and the use of nucleating layers or nucleating materials for nucleating diamond on semiconductor materials. Some alternatives may include the use of selective area nucleation.

SAD can include using photoresist (or other materials) as sacrificial layers to seed and grow diamond over a semiconductor structure. SAD may also include applying nucleation layers between photoresist coatings to define areas for diamond growth on a substrate. In some cases, during ultrasonic seeding, diamond particles may adhere to the photoresist (or a nucleating material) instead of a surface of a semiconductor structure and diamond may be grown over the semiconductor structure from the seeded diamond particles in the photoresist or other material.

Elements shown in FIG. 1-FIG. 13 are not to scale and may include, for example, magnified or exaggerated thicknesses and surface roughness.

FIG. 1 illustrates a cross-sectional view of an example substrate 100, in accordance with some embodiments disclosed herein. In some examples, the substrate 100 is a compound semiconductor-containing substrate. Substrate 100 may include a semiconductor-containing structure 101 such as a layered structure, a layer of carbon-containing material 103 such as synthetic diamond, a plurality of diamond seeds 105, an intermediate layer 111 and a second plurality of diamond seeds 113. Substrate 100 may include interface 109. In some examples, the intermediate layer 111 is an immobilizing layer, anchoring layer or tacking layer (e.g., configured to immobilize the diamond seeds 105 over a surface of the structure 101). The intermediate layer 111 may be a tacking layer configured to tack the diamond seeds 105 to a surface of the structure 101.

The interface 109 may comprise at least a portion of the diamond seeds 105. The interface 109 may comprise at least a portion of the intermediate layer 111. The interface 109 may comprise at least a portion of the diamond seeds 113.

In some examples, the interface 109 comprises at least a portion of the diamond seeds 105, at least a portion of the intermediate layer 111 and at least a portion of the diamond seeds 113.

In some examples, the interface 109 comprises a material forming a discontinuous layer across a surface of the semiconductor structure.

The interface 109 may include an articulated interface. The articulated interface may include a roughened surface of the structure 101. An articulated interface may be formed in part by the deposition of the diamond seeds 105 over a surface of the structure 101. An articulated interface may be formed in part by etching at least a portion of a surface of the structure 101. An articulated surface may comprise an average peak to trough distance of greater than about 10 nm, about 20 nm, about 50 nm, about 100 nm, about 200 nm, about 500 nm, or more.

The interface 109 may have a thickness, for example, from about 25 nm to about 28 nm. The interface 109 may have a thickness, for example, from about 25 nm to about 30 nm, from about 30 nm to about 70 nm, or from about 60 nm to about 400 nm. The interface 109 may have a thickness greater than about 50 nm. The interface 109 may have a thickness less than about 500 nm, less than about 200 nm, less than about 150 nm, less than about 100 nm, less than about 50 nm, less than about 30 nm, or less than about 10 nm. In some examples, the interface 109 may have a thickness greater than about 25 nm.

The interface 109 may have a thickness, for example, from about 75 nm to about 100 nm, from about 100 nm to about 500 nm, or from about 500 nm to about 1,000 nm. The interface 109 may have a thickness greater than about 1,000 nm.

The interface 109 may have an average thickness variation (e.g., variance) across a surface of the structure 101, for example, as measured normal to a surface of the structure 101. The thickness variance of the interface 109 may be determined, for example, by measuring the thickness of the interface 109 at a plurality of discrete locations within a region over a surface of the structure 101. The thickness measurement may be taken in a direction that is normal to a surface of the structure 101 (e.g., a backside surface of the structure 101). A discrete location of thickness measurement may have an area from about 10 nm to about 100 nm. A region may be, for example, from about 1 micron to about 10 microns, or greater.

In some examples, the interface 109 may have an average thickness variance from about 15 nm to about 200 nm, greater than about 5 nm, greater than about 10 nm, greater than about 15 nm, greater than about 20 nm, greater than about 50 nm, greater than about 100 nm or greater. In some examples, the interface 109 comprises the intermediate layer 111 and has a thickness variance of greater than about 15 nm.

The interface 109 may comprise an interface between at least a portion of the diamond seeds 105 and a surface of the structure 101. The interface 109 may comprise an interface between at least a portion of the material 103 and the intermediate layer 111. The interface 109 may comprise an interface between at least a portion of the intermediate layer 111 and the structure 101. The interface 109 may comprise an interface between at least a portion of the diamond seeds 113 and the material 103.

The interface 109 may comprise at least a portion of the diamond seeds 105 in contact with the surface of the structure 101. The interface 109 may comprise at least a portion of the material 103 in contact with the diamond seeds 113. The interface 109 may comprise at least a portion of the intermediate layer 111 in contact with diamond seeds 113. The interface 109 may comprise at least a portion of the intermediate layer 111 in contact with the structure 101. The interface 109 may comprise at least a portion of the intermediate layer 111 in contact with the material 103.

In some examples, the interface 109 may comprise a region having an average value of thermal boundary resistance less than about 20 meter^2 Kelvin (m^2 K/GW), less than 15 m^2 K/GW, or from about 1 m^2 K/GW to about 12 m^2 K/GW.

The intermediate layer 111 may have a thickness, for example, from about 5 nm to about 150 nm. The intermediate layer 111 may have a thickness from about 10 nm to about 30 nm, less than about 200 nm, less than about 150 nm, less than about 100 nm, less than about 50 nm, less than about 30 nm, or less than about 10 nm. In some examples, the intermediate layer 111 may have a thickness greater than about 25 nm, for example, from about 25 nm to about 30 nm.

The material 103 may have an average value of thermal conductivity equal to or greater than about 1,000 W/mK. The diamond seeds 105 may have an average value of thermal conductivity from about 50 W/mK to about 500 W/mK, or greater. The diamond seeds 113 may have an average value of thermal conductivity from about 8 W/mK to about 200 W/mK, or greater. In some examples, the diamond seeds (e.g., 105, 113 or both) have an average value of thermal conductivity equal to or less than about 1,000 W/mK, equal to or less than about 750 W/mK, equal to or less than about 500 W/mK, equal to or less than about 100 W/mK or equal to or less than about 50 W/mK. In some examples, the interface 109 may have an average value of thermal conductivity from about 3 W/mK to about 1,000 W/mK, equal to or greater than about 1,000 W/mK, equal to or less than about 1,000 W/mK, equal to or less than about 500 W/mK, equal to or less than about 100 W/mK, equal to or equal to about 100 W/mK, or equal to or equal to about 50 W/mK. The diamond seeds 105 may have an average diameter from about 40 nm to about 300 nm. In some examples, the diamond seeds 105 may have an average diameter from about 50 nm to about 200 nm, from about 60 nm to about 150 nm, less than about 200 nm, less than about 150 nm, less than about 100 nm, less than about 75 nm, less than about 60 nm, less than about 50 nm, or less. In some examples, the diamond seeds 105 are micro diamond seeds. The diamond seeds 113 may have an average diameter from about 5 nm to about 60 nm. In some examples, the diamond seeds 113 may have an average diameter from about 5 nm to about 50 nm, less than about 100 nm, less than about 75 nm, less than about 60 nm, less than about 50 nm, less than about 25 nm, less than about 10, or less. In some examples, the diamond seeds 113 are nano diamond seeds. In some examples, the diamond seeds 113 may comprise a smaller average diameter than the diamond seeds 105. In some examples, the diamond seeds 105 form a discontinuous layer across a surface of the structure 101. In some examples, the diamond seeds 113 form a discontinuous layer across a surface of the intermediate layer 111. For example, a discontinuous layer may comprise "islands" of diamond seed within, or adjacent to, an intermediate layer or islands of intermediate layer within, or adjacent to, an area with high diamond seed coverage. In some examples, a discontinuous layer may comprise "islands" of diamond seed within an interface. In some examples, a discontinuous layer may comprise "islands" of intermediate layer within an area with high diamond seed coverage and the area of high diamond seed coverage may be within an interface.

In some examples, at least a portion of the plurality of the diamond seeds 113 may form an interlocking interface. The interlocking interface may form as diamond crystals grow from the diamond seeds 113 to form the material 103, for example, wherein material 103 is diamond. Diamond crystals may form in a plurality of columns that each grow in a direction away from each of the plurality of diamond seeds 113. In some examples, two or more diamond crystal columns may grow from a separate diamond seed 113 and may grow into one another, coalescing at a distance from a surface of the structure 101. This may occur, at least in part, because of the disposition of the plurality of diamond seeds 113 across the intermediate layer 111 and the diamond seeds 105, for example, wherein the diamond seeds 113 are disposed at varied distances from a surface of the structure 101. FIG. 9B illustrates the coalescence of the diamond columns growing from the diamond seeds 113 in greater detail.

An interlocking interface may assist, at least in part, in increasing an average value of thermal conductivity of a region of the interface 109 and may also reduce an average value of thermal boundary resistance of a region of the interface 109. Without being limited by theory, an interlocking and/or articulated interface may act as thermal fins in a heat sink. In some examples, the interface 109 may comprise the interlocking interface. The interlocking interface may assist in nucleating the growth of the material 103. In some cases, the interlocking interface may ameliorate problems forming a stable interface between materials with very different expansion coefficients.

The structure 101 may include a wide-bandgap semiconductor. The structure 101 may include GaN, AlN, InGaN, InAlN, AlGaN, InGaAlN, Ga2O3, ScAlN, and derivatives or combinations thereof. In some examples, the intermediate layer 111 comprises SiN.

In some examples, the diamond seeds 105 and the diamond seeds 113 may assist in providing the substrate 100 with at least a region having a higher average value of thermal conductivity. For example, substrate 100 may comprise an interface between the structure 101 and the material 103 that has a higher average value of thermal conductivity compared to a substrate without the presence of diamond seeds 105 or diamond seeds 113.

In some examples, the diamond seeds 105 and the diamond seeds 113 may assist in providing the substrate 100 with at least a region having a lower average value of thermal boundary resistance. For example, substrate 100 may comprise a region of an interface between the structure 101 and the material 103 having a lower average value of thermal boundary resistance compared to a substrate without the presence of diamond seeds 105 or diamond seeds 113. For example, the diamond seeds may increase a surface area for thermal conductance.

FIG. 2 illustrates a cross-sectional view of an example substrate 200, in accordance with some embodiments disclosed herein. In some examples, the substrate 200 is a compound semiconductor-containing substrate. Substrate 200 may include properties and/or elements similar to those described with respect to substrate 100 of FIG. 1. Substrate 200 may include interface 209. The interface 209 may comprise an intermediate layer 211. The intermediate layer 211 may be an immobilizing layer or a tacking layer (e.g., configured to tack the diamond seeds 105 to a surface of the structure 101). The interface 209 may include an articulated interface. The articulated interface may include a roughened surface of the structure 101.

An articulated interface may be formed in part by removing at least a portion of the structure 101, for example, through an etching process. Interface 209 may have a larger area compared to the area of interface 109 of substrate 100 in FIG. 1. The articulated interface may comprise at least a portion of the material 103 and at least a portion of the structure 101. The material 103 may be generated over an articulated surface of the structure 101, for example, after a surface of the structure 101 is etched, as described further with respect to FIG. 6A and FIG. 6B. Interface 209 may include a greater amount of contact between the intermediate layer 211 and the structure 101 compared to interface 109 of substrate 100 in FIG. 1. Interface 209 may include a greater amount of contact between the intermediate layer 211 and the material 103 compared to interface 109 of substrate 100 in FIG. 1.

In some examples, the interface 209 may have an average value of thermal conductivity from about 3 W/mK to about 1,000 W/mK or equal to or greater than about 1,000 W/mK. In some examples, the interface 109 may comprise a region having an average value of effective thermal boundary resistance less than about 20 meter^2 Kelvin (m^2 K/GW), less than 15 m^2 K/GW, or from about 1 m^2 K/GW to about 12 m^2 K/GW. The interface 109 may have a thickness, for example, from about 25 nm to about 30 nm, from about 30 nm to about 70 nm, or from about 60 nm to about 400 nm. The interface 109 may have a thickness greater than about 50 nm. In some examples, the interface 109 may have a thickness greater than about 25 nm, for example, from about 25 nm to about 28 nm.

In some examples, the interface 209 may comprise a region having a higher average value of thermal conductivity compared to interface 109. The higher average value of thermal conductivity may be due at least in part to a greater amount of contact between the intermediate layer 211 and the structure 101, or the greater amount of contact between intermediate layer 211 and the material 103. In some examples, the interface 209 may comprise a region having a lower average value of thermal boundary resistance compared to interface 109, at least in part because of the greater amount of contact between the intermediate layer 211 and the structure 101, or the greater amount of contact between intermediate layer 211 and the material 103.

In some examples, the interface 209 comprises one or more etched regions in the structure 101. An etched region may be, for example, a hollow region in the structure 101, a hole in the structure 101, or a trench in the structure 101. Trenches may be formed in the structure 101 following an etching of at least a portion of a surface of the structure 101, as further described with respect to FIG. 6A-FIG. 6C. In some examples, the trenches may comprise at least a portion of the material 103. The trenches may comprise at least a portion of the plurality of the diamond seeds 113. The material 103 may be grown from the plurality of diamond seeds 113. In some examples, the material 103 within the trenches may form an interlocking interface with the portions of the structure 101 that have not been etched. One or more of the diamond seeds 105 may also form a portion of the interlocking interface. The interface 209 may comprise at least a portion of the interlocking interface. In some examples, the interlocking interface may assist in increasing an average value of adhesion strength ($J/m^2$) as of the material 103 to the structure 101 (e.g., adhesion strength of the interface between the material 103 and structure 101). Adhesion strength may be measured, for example, by a surface blister method.

The interface 209 may comprise at least a portion of the diamond seeds 105. The interface 209 may comprise at least a portion of the intermediate layer 211. The interface 209 may comprise at least a portion of the diamond seeds 113. The diamond seeds 105 may have an average value of thermal conductivity from about 50 W/mK to about 500 W/mK, or greater. The diamond seeds 113 may have an average value of thermal conductivity from about 8 W/mK to about 200 W/mK. The diamond seeds 105 may have an average diameter from about 40 nm to about 300 nm. In some examples, the diamond seeds 105 are micro diamond seeds. The diamond seeds 113 may have an average diameter from about 5 nm to about 60 nm. In some examples, the diamond seeds 113 are nano diamond seeds.

In some examples, the interface 209 comprises at least a portion of the diamond seeds 105, at least a portion of the intermediate layer 211 and at least a portion of the diamond seeds 113.

In some examples, the interface 209 comprises a material forming a discontinuous layer across a surface of the semiconductor structure. In some examples, the diamond seeds 105 form a discontinuous layer across a surface of the structure 101. In some examples, the diamond seeds 113 form a discontinuous layer across a surface of the intermediate layer 211.

The interface 209 may have a thickness, for example, from about 75 nm to about 100 nm, from about 100 nm to about 500 nm, or from about 500 nm to about 1,000 nm. The interface 209 may have a thickness greater than about 1,000 nm. The interface 209 may have a thickness, for example, from about 25 nm to about 30 nm, from about 30 nm to about 70 nm, or from about 60 nm to about 400 nm. The interface 209 may have a thickness greater than about 50 nm. In some examples, the interface 209 may have a thickness greater than about 25 nm, for example, from about 25 nm to about 28 nm.

The interface 209 may have an average thickness variance across a surface of the structure 101, for example, as measured normal to a surface of the structure 101. The thickness variance of the interface 209 may be determined, for example, by measuring the thickness of the interface 209 at a plurality of discrete locations within a region over a surface of the structure 101. The thickness measurement may be taken in a direction that is normal to a surface of the structure 101 (e.g., a backside surface of the structure 101). A discrete location of thickness measurement may have an area from about 10 nm to about 100 nm. A region may be, for example, from about 1 micron to about 10 microns, or greater.

In some examples, the interface 209 may have an average thickness variance from about 150 nm to about 1,000 nm, greater than about 5 nm, greater than about 10 nm, greater than about 15 nm, greater than about 20 nm, greater than about 50 nm, greater than about 100 nm, greater than 500 nm, greater than 750 nm or greater. In some examples, the interface 109 comprises the intermediate layer 111 and has a thickness variance of greater than about 15 nm.

In some examples, at least a portion of the plurality of the diamond seeds 113 may form an interlocking interface. The interlocking interface may form as diamond crystals grow from the diamond seeds 113 to form the material 103, for example, wherein material 103 is diamond. Diamond crystals may form in a plurality of columns that each grow in a direction away from each of the plurality of diamond seeds 113. In some examples, two or more diamond crystal columns may grow from a separate diamond seed 113 and may grow into one another, coalescing at a distance from a surface of the structure 101. This may occur, at least in part, because of the disposition of the plurality of diamond seeds 113 across the structure 101 (e.g., across the intermediate layer 211 and the diamond seeds 105), for example, wherein the diamond seeds 113 are disposed at varied distances from a surface of the structure 101. FIG. 9B illustrates the coalescence of the diamond columns growing from the diamond seeds 113 in greater detail.

An interlocking interface may assist, at least in part, in increasing an average value of thermal conductivity of a region of the interface 209 and may also reduce an average value of thermal boundary resistance of a region of the interface 209, In some examples, the interface 209 may comprise the interlocking interface. The interlocking interface may assist in nucleating the growth of the material 103.

The example methods described with respect to FIG. 3 through FIG. 8B may include additional or even fewer operations or processes in comparison to what is illustrated in any of FIG. 3 through FIG. 8B. Additionally, examples of the methods described with respect to FIG. 3 through FIG. 8B are not necessarily limited to the chronological order that is shown in such figures.

Figure 3:
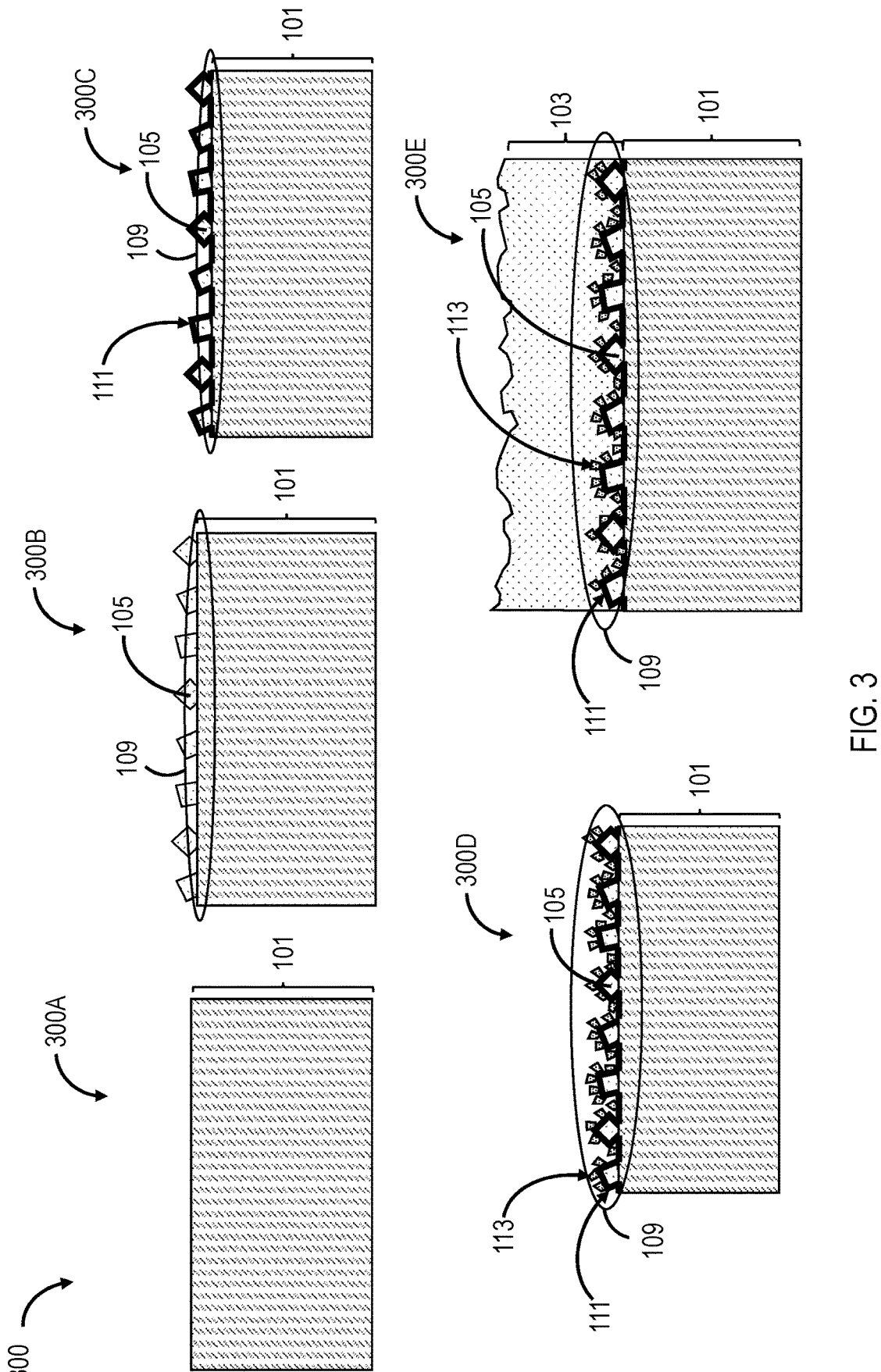
FIG. 3 illustrates a cross-sectional view of an example method of forming a semiconductor structure, in accordance with some embodiments disclosed herein.

FIG. 3 illustrates generally a cross-sectional view of an example method 300 of forming a semiconductor structure, in accordance with some embodiments disclosed herein.

Figure 4:
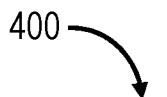
FIG. 4 illustrates generally a flowchart of an example method of manufacturing a substrate, in accordance with some embodiments disclosed herein.
Figure 4:
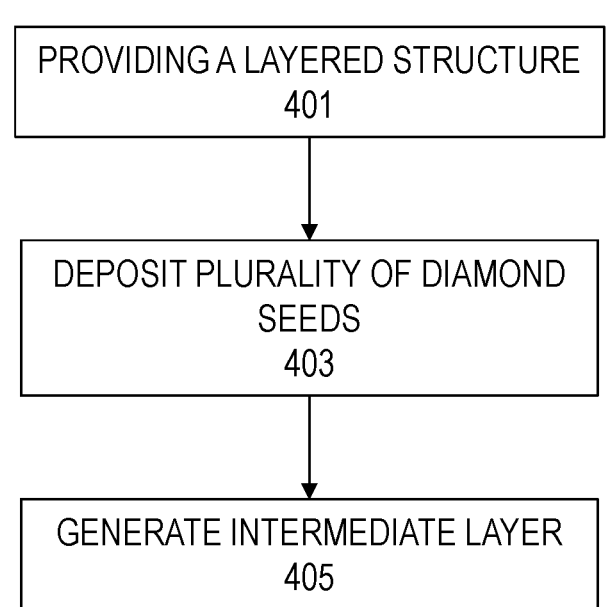
Figure 5:
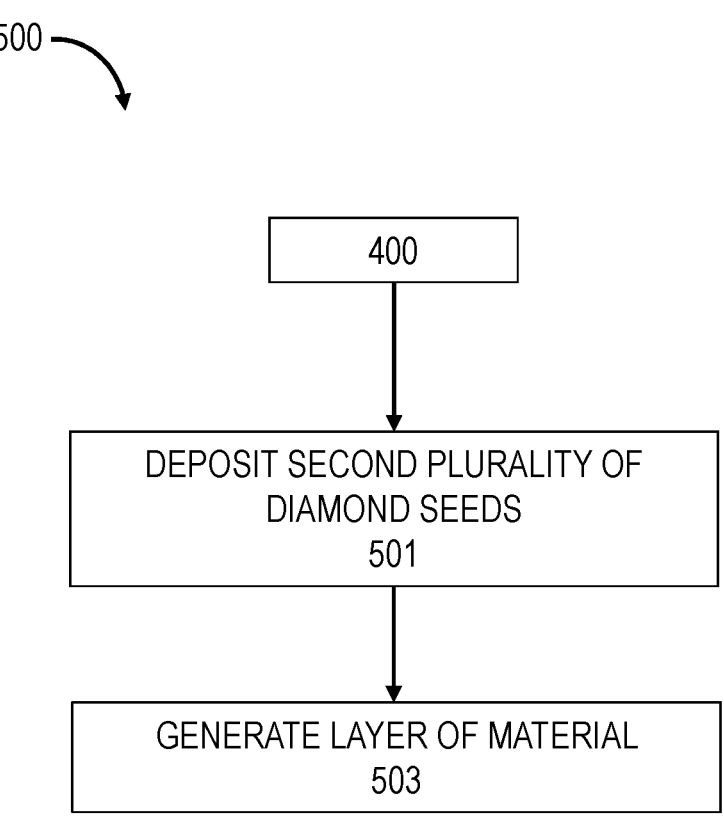
FIG. 5 illustrates generally a flowchart of an example method of manufacturing a substrate, in accordance with some embodiments disclosed herein.

Method 300 may include operations 300A, 300B, 300C, 300D and 300E. In some examples, FIG. 3 illustrates a method of generating a substrate having properties and elements similar to those described with respect to substrate 100. FIG. 4 illustrates generally a flow diagram of an example method 400 of generating a substrate, in accordance with some examples. Method 400 may include operations 401, 403 and 405. FIG. 5 illustrates generally a flow diagram of an example method 500 of generating a substrate, in accordance with some examples. Method 500 includes operations 501 and 503. In some examples, method 500 includes elements of method 400.

In operation 401, and as illustrated for example in operation 300A, a layered structure (e.g., structure 101) is provided. The structure 101 may comprise a semiconductor-containing structure. The structure 101 may comprise one or more layers of a wide-bandgap semiconductor material. The wide-bandgap semiconductor material may be single-crystalline. The structure 101 may comprise a buffer layer. The structure 101 may comprise GaN. The structure 101 may comprise AlGaN.

In some examples, the structure 101 may be formed on a separate growth substrate (not shown), which may include silicon. The structure 101 may include transition layers (not shown). The transition layers may be formed proximal to a growth substrate. In some examples, the structure 101 may be epitaxially grown on a first substrate, flipped, and attached to a second substrate or carrier wafer (not shown). The first substrate may be removed from the structure 101. One or more layers of the structure 101 may also be removed (e.g., by etching or mechanical polishing), which may include transition layer(s). A surface of the structure 101 may be exposed for subsequent processing. In some examples, the exposed surface of the structure 101 may comprise substantially only GaN.

In operation 403, and as illustrated for example in operation 300B, a plurality of diamond seeds 105 is deposited over at least a portion of a surface of the structure 101. The diamond seeds 105 may be deposited, for example, using an ultrasonic seeding method as described herein. The diamond seeds 105 may be deposited over the structure 101, wherein the diamond seeds 105 and the structure 101 form at least part of an interface 109. The interface 109 may be a single interface between the diamond seeds and the structure 101. In some examples, the diamond seeds 105 may be deposited on a back side of the structure 101. In some examples, the diamond seeds 105 may be deposited on a front side of the structure 101.

In some examples, the diamond seeds 105 may have an average value of thermal conductivity from about 50 W/mK to about 1,000 W/mK, less than about 500 W/mK, or greater than about 1,000 W/mK.

In some examples, the diamond seeds 105 may have an average diameter from about 40 nm to about 300 nm. In some examples, the diamond seeds 105 have an average diameter of about 90 nm. In some examples, the diamond seeds 105 have an average diameter of about 50 nm, about 80 nm, about 100 nm, about 200 nm, about 300 nm, or about 500 nm, or more.

In operation 405, and as illustrated for example in operation 300C, an intermediate layer 111 is generated, grown or deposited over at least a portion of a surface of the resulting structure from operation 300B. For example, the intermediate layer 111 is generated over at least a portion of the diamond seeds 105 and the structure 101. The intermediate layer 111 may be generated over at least a portion of the diamond seeds 105. The interface 109 may comprise at least part of the intermediate layer 111. The intermediate layer 111 may be in contact with at least part of the diamond seeds 105 and the structure 101. The interface 109 may include an interface between the intermediate layer 111 and the diamond seeds 105. The interface 109 may include an interface between the intermediate layer 111 and the structure 101. The intermediate layer 111 may have a thickness from about 5 nm to about 150 nm. In some examples, the intermediate layer 111 may have a thickness greater than about 25 nm, for example, from about 25 nm to about 28 nm, or from about 25 nm to about 30 nm. The intermediate layer 111 may have an average thickness variance across a surface of the structure 101 that is greater than about 15 nm, for example, as measured normal to a surface of the structure 101.

Direct contact between the diamond seeds 105 and the structure 101 at the interface 109 can include atoms of a material (e.g., GaN) of the structure 101 combining with atoms of the diamond seeds 105. In some examples, the concentration of atoms at interface 109 includes substantially atoms of one type of material of the structure 101 and atoms of the diamond seeds 105. The intermediate layer 111 may comprise a semiconductor material. In some examples, the intermediate layer 111 comprises SiN.

In some examples, prior to depositing the diamond seeds 105, a surface of the structure 101 may be treated with ion implantation. The ion implantation may assist in reducing or eliminating electrical conductivity on a surface of the structure 101. Ions for implantation can include carbon ions and oxygen ions, for example. Such operations may not necessarily be in this order.

Referring to FIG. 5, in operation 501, and as illustrated for example in operation 300D, a second plurality of diamond seeds 113 may be deposited over a surface of the intermediate layer 111. The diamond seeds 113 may have an average value of thermal conductivity from about 8 W/mK to about 200 W/mK, or greater. The diamond seeds 113 may have an average diameter from about 5 nm to about 60 nm.

In operation 503, and as illustrated for example in operation 300E, a material 103 is generated (e.g., grown) over at least a portion of the resulting structure from operation 300D.

In some examples, at least a portion of the plurality of the diamond seeds 113 may form an interlocking interface. The interlocking interface may form as diamond crystals grow from the diamond seeds 113 to form the material 103, for example, wherein material 103 is diamond.

In some examples, the material 103 is generated over at least a portion of the diamond seeds 113. In some examples, the material 103 is generated over at least a portion of the intermediate layer 111. In some examples, the material 103 is generated over at least a portion of an interlocking interface formed between two or more diamond seeds of the plurality of diamond seeds 113. In some examples, the material 103 is a carbon-containing material. In some examples, the material 103 has an average value of thermal conductivity equal to or greater than about 1,000 W/mK. In some examples, the material 103 comprises diamond. The thermal conductivity may be measured at a temperature of about 23° C. The material 103 may have a thickness of about 1,000 micrometers (μm) or less. The material 103 may have a thickness within in a range from about 10 μm to about 600 μm. The material 103 may have a thickness of less than about 600 μm, less than about 250 μm, less than about 150 μm, less than about 100 μm or less. A surface of the material 103 may be ground or polished to reduce or eliminate surface roughness of the material 103.

Figure 6A:
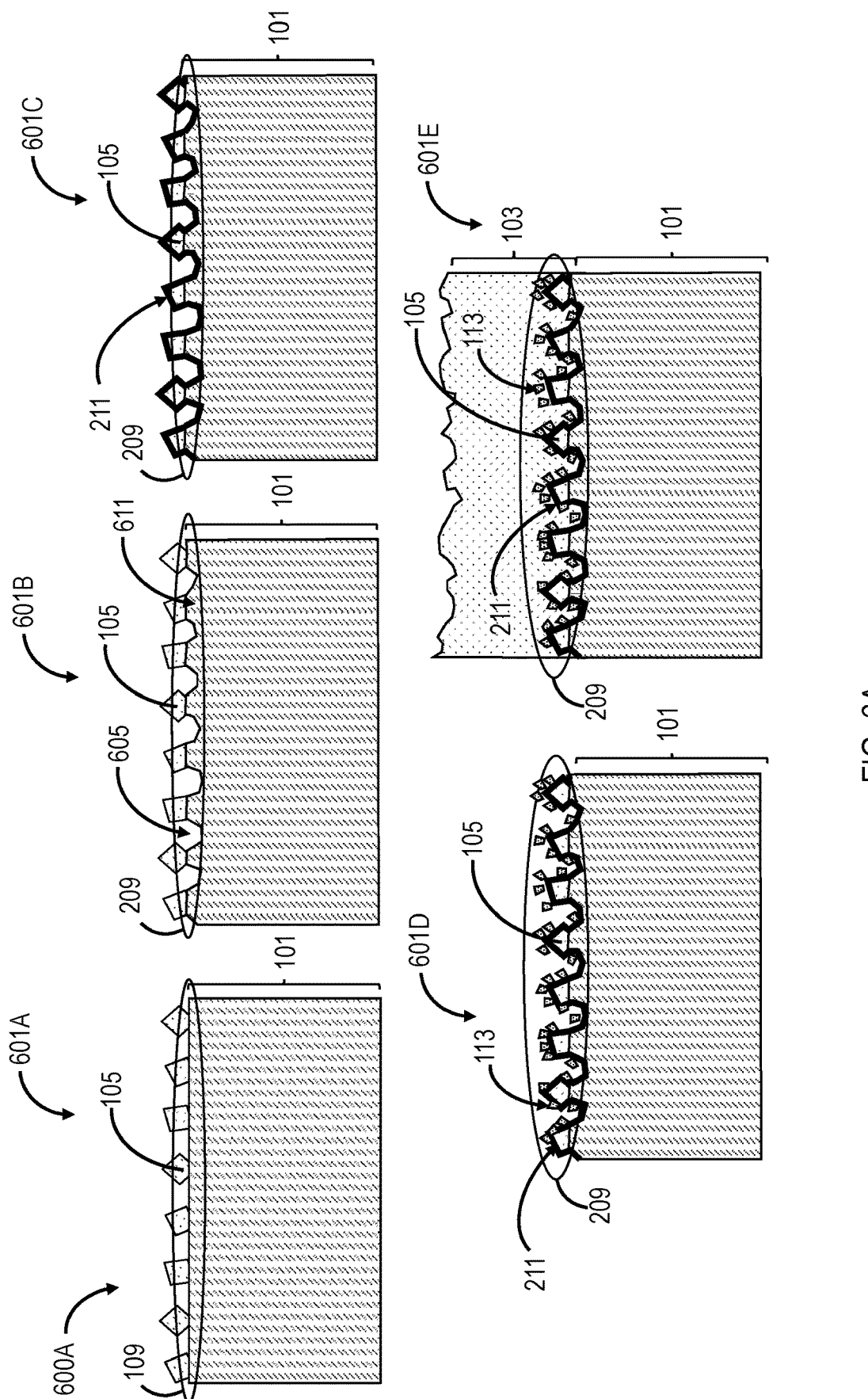
FIG. 6A illustrates a cross-sectional view of an example method of manufacturing a substrate, in accordance with some embodiments disclosed herein.
Figure 6B:
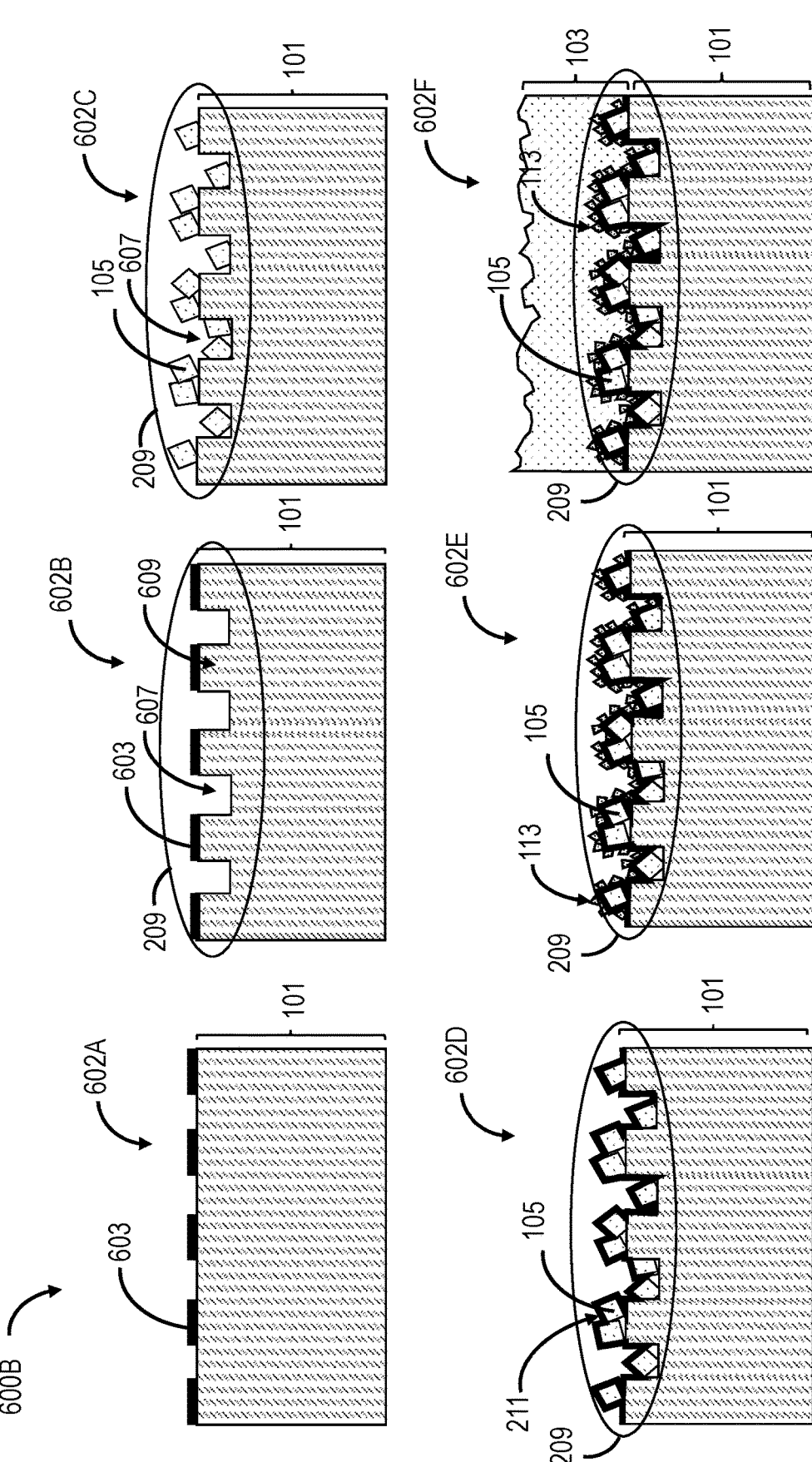
FIG. 6B illustrates a cross-sectional view of an example method of manufacturing a substrate, in accordance with some embodiments disclosed herein.
Figure 6C:
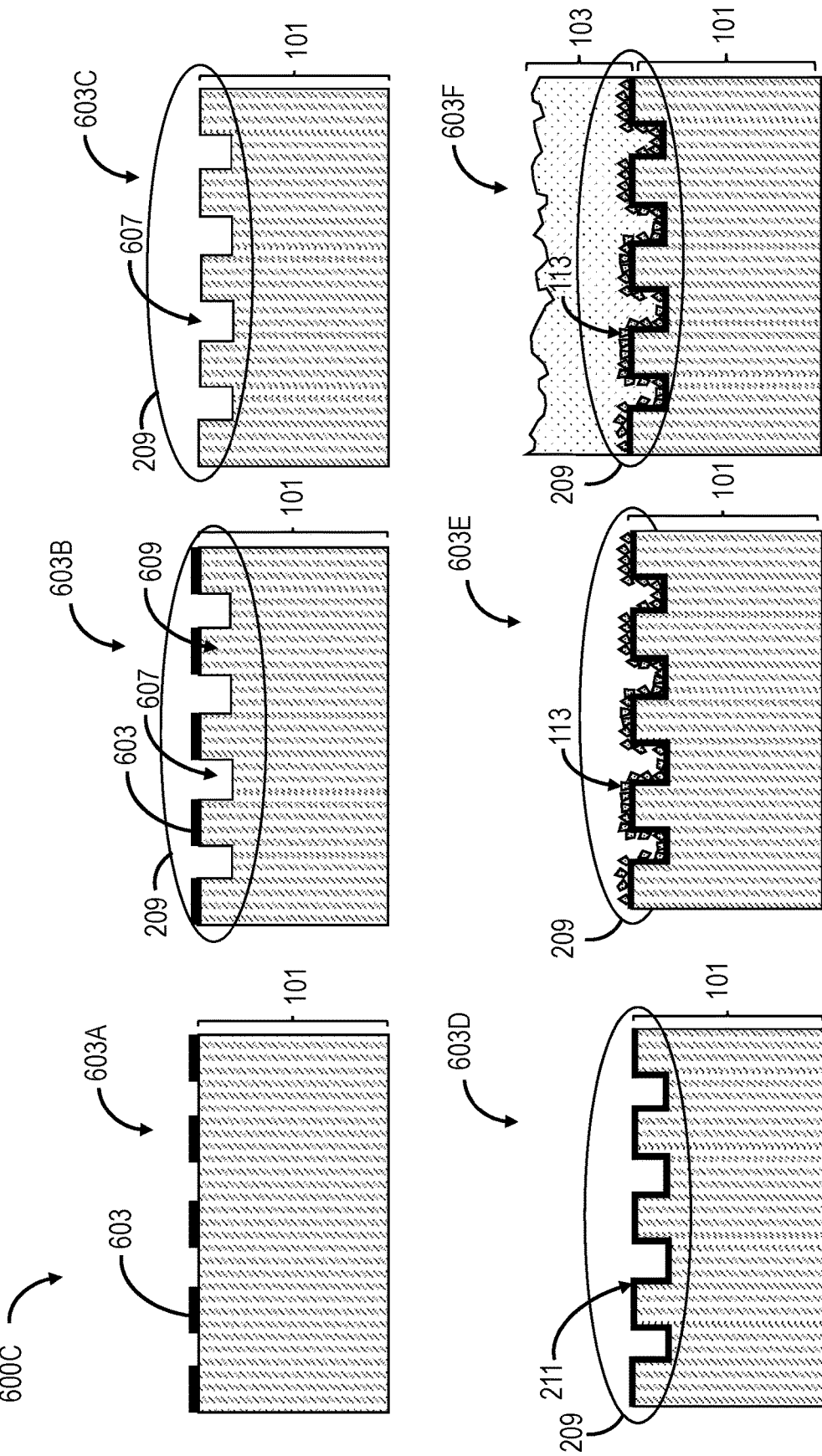
FIG. 6C illustrates a cross-sectional view of an example method of manufacturing a substrate, in accordance with some embodiments disclosed herein.

FIG. 6A illustrates generally a cross-sectional view of an example method 600A of manufacturing a substrate, in accordance with some embodiments disclosed herein. Method 600A may include operations 601A, 601B, 601C, 601D and 601E. In some examples, FIG. 6A illustrates a method of generating a substrate having properties and elements similar to those described with respect to substrate 200. FIG. 6B illustrates generally a cross-sectional view of an example method 600B of manufacturing a substrate, in accordance with some embodiments disclosed herein. Method 600B may include operations 602A, 602B, 602C, 602D, 602E and 602F. In some examples, FIG. 6B illustrates a method of generating a substrate having properties and elements similar to those described with respect to substrate 200. FIG. 6C illustrates generally a cross-sectional view of an example method 600C of manufacturing a substrate, in accordance with some embodiments disclosed herein. Method 600C may include operations 603A, 603B, 603C, 603D, 603E and 603F. In some examples, FIG. 6C illustrates a method of generating a substrate having properties and elements similar to those described with respect to substrate 200.

Figure 7A:
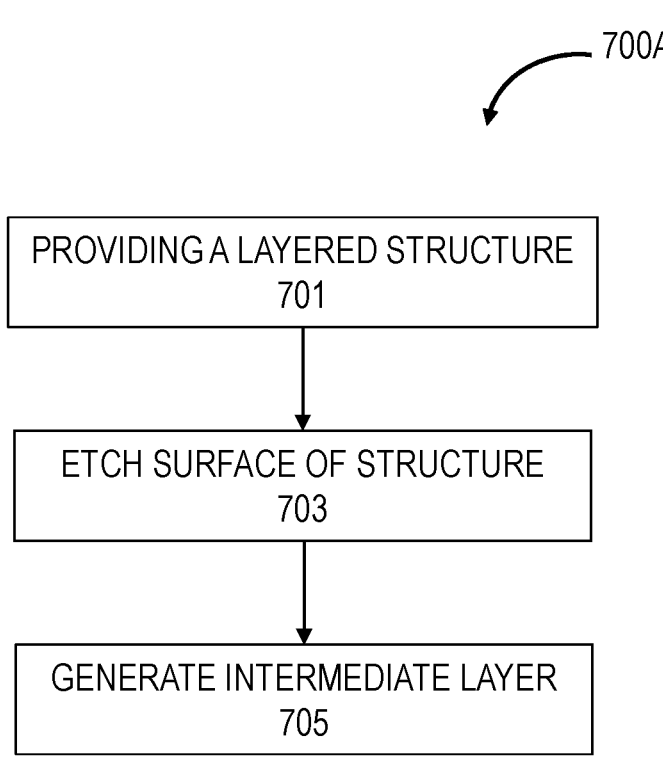
FIG. 7A illustrates generally a flowchart of an example method of manufacturing a substrate, in accordance with some embodiments disclosed herein.
Figure 7B:
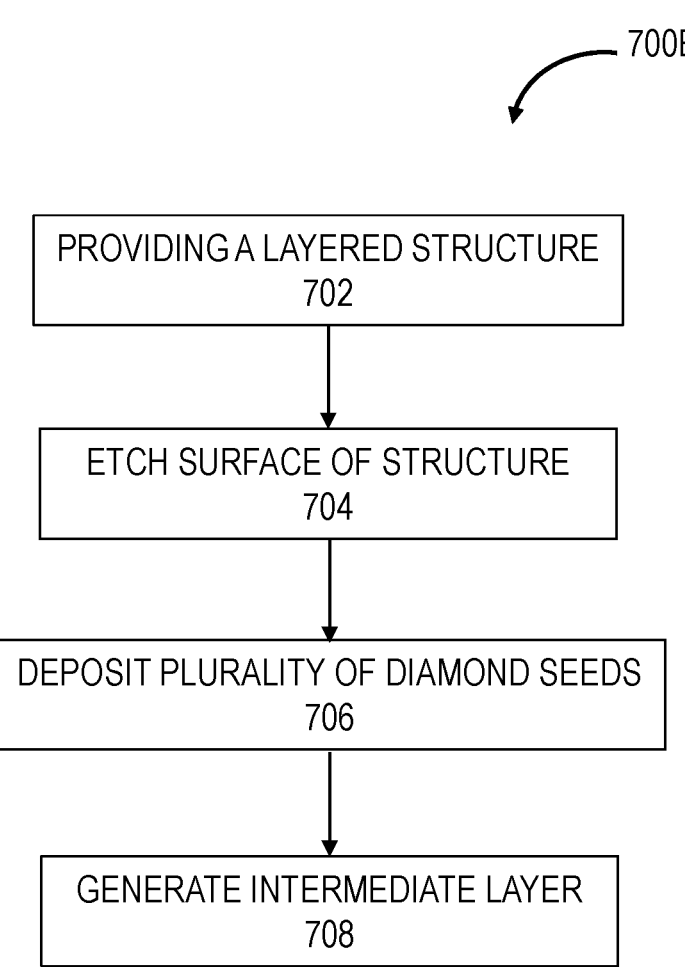
FIG. 7B illustrates generally a flowchart of an example method of manufacturing a substrate, in accordance with some embodiments disclosed herein.
Figure 7C:
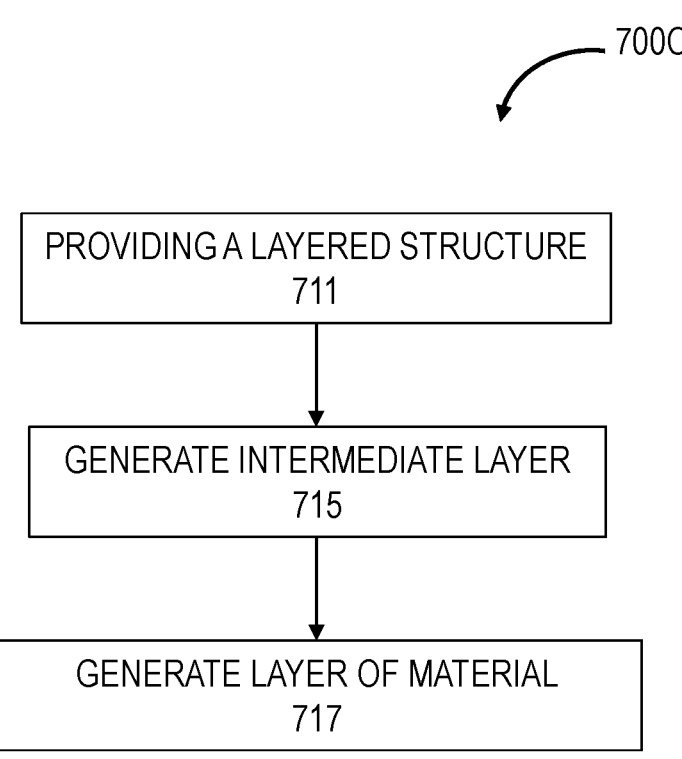
FIG. 7C illustrates generally a flowchart of an example method of manufacturing a substrate, in accordance with some embodiments disclosed herein.
Figure 7D:
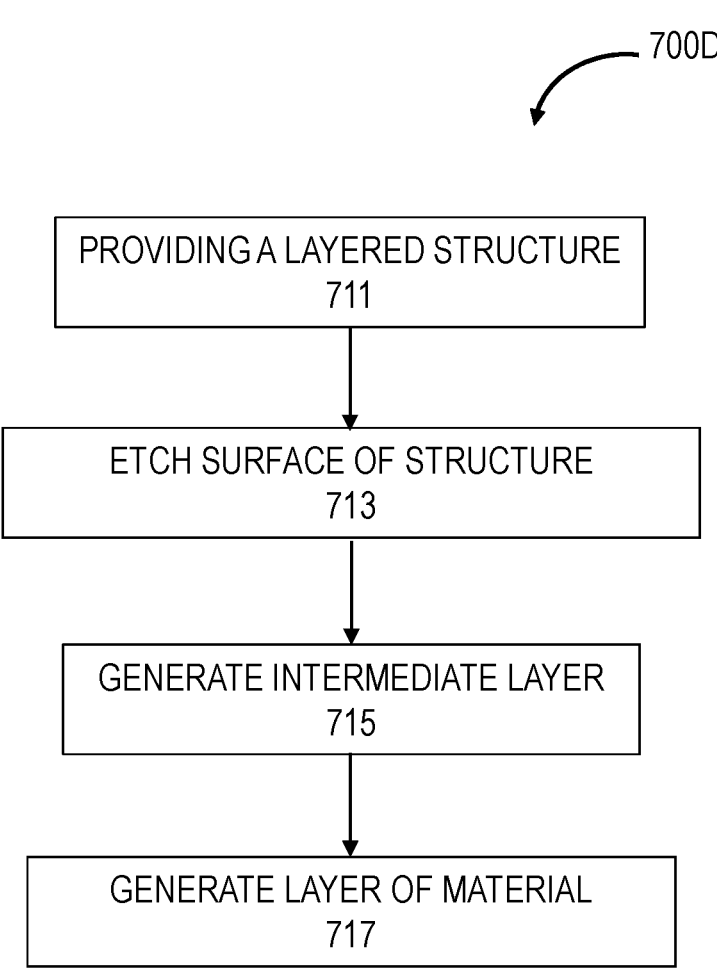
FIG. 7D illustrates generally a flowchart of an example method of manufacturing a substrate, in accordance with some embodiments disclosed herein.

FIG. 7A illustrates generally a flow diagram of an example method 700A of generating a substrate, in accordance with some examples. Method 700A may include operations 701, 703 and 705. FIG. 7B illustrates generally a flow diagram of an example method 700B of generating a substrate, in accordance with some examples. Method 700B may include operations 702, 704 and 706. FIG. 7C illustrates generally a flow diagram of an example method 700C of generating a substrate, in accordance with some examples. Method 700C may include operations 711, 713 and 717. FIG. 7D illustrates generally a flow diagram of an example method 700D of generating a substrate, in accordance with some examples. Method 700D may include operations 711, 713, 715 and 717. Method 700D may one or more similar operations to FIG. 7C.

Figure 8A:
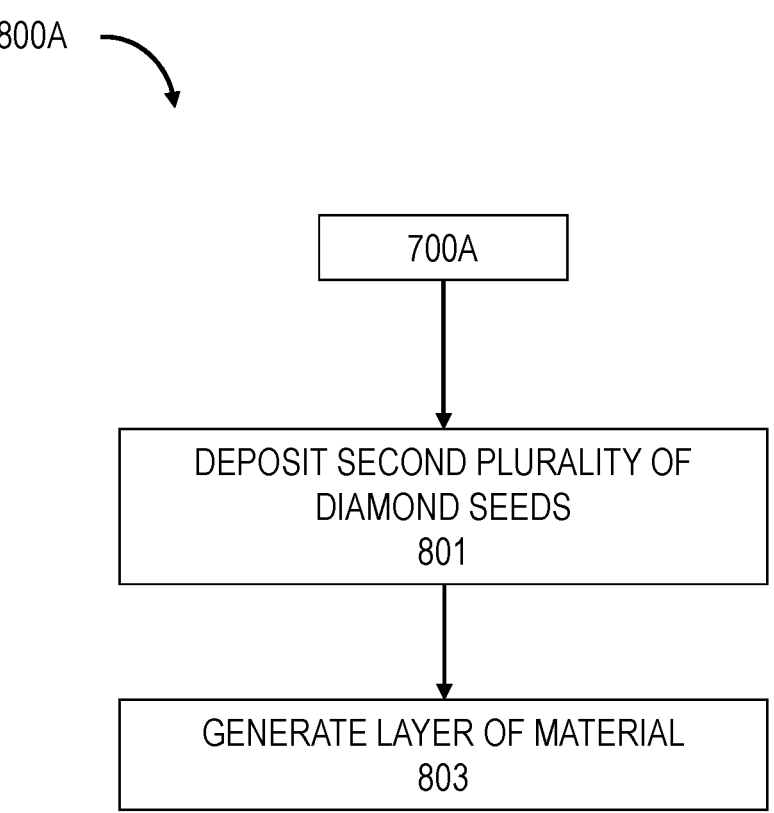
FIG. 8A illustrates generally a flowchart of an example method of manufacturing a substrate, in accordance with some embodiments disclosed herein.
Figure 8B:
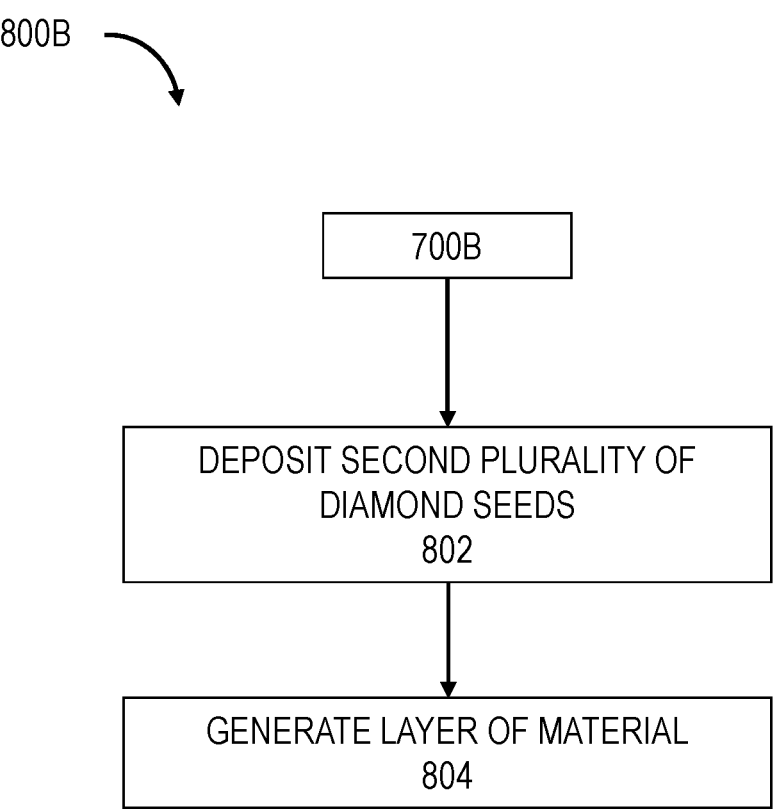
FIG. 8B illustrates generally a flowchart of an example method of manufacturing a substrate, in accordance with some embodiments disclosed herein.

FIG. 8A illustrates generally a flow diagram of an example method 800A of generating a substrate, in accordance with some examples. Method 800A includes operations 801 and 803. In some examples, method 800A includes elements of method 700A. FIG. 8B illustrates generally a flow diagram of an example method 800B of generating a substrate, in accordance with some examples. Method 800B includes operations 802 and 804. In some examples, method 800B includes elements of method 700B.

Referring to FIG. 7A, in operation 701, and as illustrated for example in operation 601A of FIG. 6A, a layered structure (e.g., structure 101) is provided. The structure 101 may comprise a semiconductor-containing structure. The structure 101 may comprise one or more layers of a wide-bandgap semiconductor material. The wide-bandgap semiconductor material may be single-crystalline. The structure 101 may comprise a buffer layer. The structure 101 may comprise GaN. The structure 101 may comprise AlGaN.

In some examples, the structure 101 may be formed on a separate growth substrate (not shown), which may include silicon. The structure 101 may include transition layers (not shown). The transition layers may be formed proximal to growth substrate. In some examples, the structure 101 may be epitaxially grown on a first substrate, flipped and attached to a second substrate or carrier wafer (not shown). The first substrate may be removed from the structure 101. One or more layers of the structure 101 may also be removed (e.g., by etching or mechanical polishing), which may include transition layer(s). A surface of the structure 101 may be exposed for subsequent processing. In some examples, the exposed surface of the structure 101 may comprise substantially only GaN.

In some examples, the structure 101 comprises a plurality of diamond seeds 105 deposited over at least a portion of a surface of the structure 101. The diamond seeds 105 may be deposited, for example, using an ultrasonic seeding method as described herein. The diamond seeds 105 may be deposited over the structure 101, wherein the diamond seeds 105 and the structure 101 form at least part of an interface 109. The interface 109 may be a single interface between the diamond seeds and the structure 101. In some examples, the diamond seeds 105 may be deposited on a back side of the structure 101. In some examples, the diamond seeds 105 may be deposited on a front side of the structure 101.

In some examples, the diamond seeds 105 may have an average value of thermal conductivity as described herein, e.g., from about 50 W/mK to about 500 W/mK, or greater.

In some examples, the diamond seeds 105 may have an average diameter from about 40 nm to about 300 nm. In some examples, the diamond seeds 105 have an average diameter of about 90 nm. In some examples, the diamond seeds 105 have an average diameter of about 50 nm, about 80 nm, about 100 nm, about 200 nm, about 300 nm, or about 500 nm, or more.

In operation 703, and as illustrated for example in operation 601B, a surface of the structure 101 is etched, for example, dry etched. The surface of the structure 101 that may be etched may include GaN. In some examples, the etching may generate one or more trenches 605 in the structure 101. The trenches may be positioned, for example, in between each of the plurality of diamond seeds 105. A trench 605 may have an average depth and width. The etching of the structure 101 may form at least part of an articulated interface 209. The articulated interface 209 may comprise one or more of the trenches 605. In some examples, an etch mask may be used in etching the surface of the structure 101.

In some examples, the depth of a trench 605 may be from about 3 nm to about 3,000 nm. The depth of a trench 605 may be less than 10 micrometers (μm), less than 5 μm, less than 3 μm, less than 1 μm, less than 500 nm, less than 250 nm, less than 100 nm, less than 50 nm, less than 25 nm, less than 10 nm or less. The width of a trench 605 may be from about 10 nm to about 10 μm. The width of a trench 605 may be less than about 50 μm, about less than 30 μm, less than 10 μm, less than 1,000 nm, less than 500 nm, less than 100 nm, less than 50 nm, or less.

The articulated interface 209 may comprise a region having a higher average value of thermal conductivity compared to interface 109. The articulated interface 209 may comprise a region having a lower average value of thermal boundary resistance compared to interface 109. The material 103 that is grown within in one or more of the trenches 605 may assist, at least in part, in enabling a higher average value of adhesion strength of interface 209 compared to interface 109 (e.g., adhesion between the structure 101 and the material 103 as shown in operation 601E).

As a result, in part, from the etching of the surface of the structure 101, the interface 209 may comprise a greater area than interface 109. In some examples, as a result, in part, from the etching of the structure 101, the interface 209 may include a greater amount of exposed surface area of the structure 101 compared to the amount of exposed surface area of the structure 101 with interface 109. In some examples, as a result, in part, from the etching of the structure 101, the interface 209 may comprise one or more thermal fins 611. The thermal fins 611 may, at least in part, assist in increasing an average value of thermal conductivity of a region within the interface 209 compared to interface 109. The thermal fins 611 may increase the thermal conductivity of one or more layers of material of the substrate, for example, compared to substrate 100. The thermal fins 611 may, at least in part, assist in decreasing an average value of thermal boundary resistance of a region within the interface 209 compared to interface 109. In some examples, the etching of the structure 101 (e.g., to generate an articulated interface) may assist in the immobilization, anchoring or tacking of the diamond seeds to a surface of the structure 101. In some examples, the interface 209 may comprise an articulated interface. In some examples, the interface 209 may comprise a threshold value of surface roughness. The interface 209 may have an increased average value of thermal conductivity compared to interface 109.

In operation 705, and as illustrated for example in operation 601C, an intermediate layer 211 is generated, grown, or deposited over at least a portion of a surface of the resulting structure from operation 601B. For example, the intermediate layer 211 is generated over at least a portion of the structure 101 and the diamond seeds 105. The intermediate layer 211 may be generated over at least a portion of the plurality of the diamond seeds 105. The interface 209 may comprise at least part of the intermediate layer 211, at least a portion of the plurality of the diamond seeds 105 and at least a portion of the structure 101. The intermediate layer 211 may be in contact with at least a portion of the diamond seeds 105 and at least a portion of the structure 101. The interface 209 may include an interface between the intermediate layer 211 and the diamond seeds 105. The intermediate layer 211 may have a thickness as described herein, for example, from about 5 nm to about 150 nm. Direct contact between the diamond seeds 105 and the structure 101 at the interface 209 can include atoms of a material (e.g., GaN) of the structure 101 combining with atoms of the diamond seeds 105. In some examples, the concentration of atoms at interface 209 includes substantially atoms of one type of material of the structure 101 and atoms of the diamond seeds 105. In some examples, the intermediate layer 211 comprises SiN.

In some examples, prior to depositing the diamond seeds 105, a surface of the structure 101 may be treated with ion implantation. The ion implantation may assist in reducing or eliminating electrical conductivity on a surface of the structure 101. Ions for implantation can include carbon ions and oxygen ions, for example. Such operations may not necessarily be in this order.

Referring to FIG. 8A, in operation 801, and as illustrated for example in operation 601D, a second plurality of diamond seeds 113 may be deposited over a surface of the intermediate layer 211. The diamond seeds 113 may have an average value of thermal conductivity from about 8 W/mK to about 200 W/mK. The diamond seeds 113 may have an average diameter from about 5 nm to about 60 nm. In some examples, at least a portion of the plurality of the diamond seeds 113 may form an interlocking interface. The interlocking interface may form as diamond crystals grow from the diamond seeds 113 to form the material 103, for example, wherein material 103 is diamond.

In operation 803, and as illustrated for example in operation 601E, a material 103 is generated over at least a portion of the resulting structure from operation 601D. For example, the material 103 is generated over at least a portion of the intermediate layer 211. In some examples, the material 103 is generated over at least a portion of the diamond seeds 113. In some examples, the material 103 is generated over at least a portion of an interlocking interface formed between two or more diamond seeds of the plurality of diamond seeds 113. In some examples, the material 103 is a carbon-containing material. In some examples, the material 103 has an average value of thermal conductivity equal to or greater than about 1,000 W/mK. In some examples, the material 103 comprises diamond. The thermal conductivity may be measured at a temperature of about 23° C. The material 103 may have a thickness of about 1,000 micrometers (μm) or less. The material 103 may have a thickness within in a range from about 10 μm to about 600 μm. The material 103 may have a thickness of less than about 600 μm, less than about 250 μm, less than about 150 μm, less than about 100 μm or less. A surface of the material 103 may be ground or polished to reduce or eliminate surface roughness of the material 103. In some examples, the interface 209 may comprise a region having a greater amount of contact between the material 103 and the intermediate layer 211 compared to substrate 100. The interface 209 may comprise a region having a greater amount of contact between the material 103 and the structure 101 compared to interface 109. The interface 209 may comprise a region having an increased average value of thermal conductivity compared to interface 109. Compared to interface 109, comprising at least of a portion of material 103 in FIG. 3, the interface 209 may comprise at least a portion of the material 103 having a higher thermal conductivity.

In some examples, the material 103 within the trenches 605 may form an interlocking interface with the portions of the structure 101 that have not been etched. This may result in the material 103 being interlocked with the structure 101. One or more of the diamond seeds 105 may also form a portion of the interlocking interface. The interface 209 may comprise at least a portion of the interlocking interface. In some examples, the interlocking interface may assist in increasing an average value of adhesion strength (J/m^2) of the interface 209 (e.g., an adhesion strength of the material 103 to the structure 101). In some examples, an adhesion strength of the interface 209 may be increased by an increased surface area of the material 103 that is in contact with an increased surface area of the structure 101. The increased surface area contact may be the result of the trenches 605 formed in the structure 101 and the material 103 disposed within the trenches 605.

Referring to FIG. 7B, in operation 702, and as illustrated for example in operation 602A of FIG. 6B, a layered structure (e.g., structure 101) is provided. The structure 101 may include properties and/or elements as described herein with respect to FIG. 1-FIG. 6A. In operation 602A, an etch mask 603 is formed over at least a portion of a surface of the structure 101. The etch mask may comprise a material as described herein, for example, SiN. The etch mask 603 may comprise a pattern for etching one or more trenches into the surface of the structure 101.

In operation 704, and as illustrated for example in operation 602B of FIG. 6B, at least a portion of the surface of the structure 101 is etched. The etching may include dry etching. The etching of the structure 101 may form at least part of an articulated interface 209. In some examples, the etching may form one or more trenches 607 within the structure 101. The articulated interface 209 may comprise one or more of the trenches 607. In some examples, an area of the interface 209 is greater than an area of interface 109.

In some examples, the depth of a trench 607 may be from about 3 nm to about 3,000 nm. The depth of a trench 607 may be less than 10 μm, less than 5 μm, less than 3 μm, less than 1 μm, less than 500 nm, less than 250 nm, less than 100 nm, less than 50 nm, less than 25 nm, less than 10 nm or less. The width of a trench 605 may be from about 10 nm to about 10 micrometers. The width of a trench 607 may be less than 20 micrometers, less than 10 micrometers, less than 100 nm, less than 50 nm, less than 20 nm or less.

In some examples, the etching of the structure 101 may form one or more thermal fins 609. The thermal fins 609 may be comprised of the portions of the structure 101 that are not etched (e.g., areas below and protected by the etch mask). The thermal fins 609 may, at least in part, assist in increasing an average value of thermal conductivity of a region within the interface 209 compared to interface 109. Operation 602B may also include the removal of the etch mask 603.

In operation 706, and as illustrated for example in operation 602C of FIG. 6B, a plurality of diamond seeds 105 are deposited over the surface of the structure 101. In some examples, the diamond seeds 105 may be deposited over the surface of the structure 101 such that at least a portion of the plurality of diamond seeds 105 are disposed within one or more of the trenches 607. The articulated interface 209 may comprise at least a portion of the plurality of the diamond seeds 105. The articulated interface 209 may comprise a region having a higher average value of thermal conductivity compared to interface 109. The articulated interface 209 may comprise a region having a lower average value of thermal boundary resistance compared to interface 109. The material 103 that is grown within one or more of the trenches 607 may assist, at least in part, in enabling a higher average value of adhesion strength of interface 209 compared to interface 109 (e.g., adhesion between the structure 101 and the material 103 as shown in operation 602F).

In some examples, the etching of the structure 101 may assist in the immobilization, anchoring or tacking of the diamond seeds 105 to a surface of the structure 101. In some examples, the interface 209 may comprise a threshold value of surface roughness.

In operation 708, and as illustrated for example in operation 602D, an intermediate layer 211 is generated, grown, or deposited over at least a portion of a surface of the resulting structure from operation 602C. For example, the intermediate layer 211 is generated over at least a portion of the structure 101 and the diamond seeds 105. The intermediate layer 211 may be generated over at least a portion of the plurality of the diamond seeds 105. The intermediate layer 211 may be in contact with and form at least part of an interface 209 with at least a portion of the plurality of the diamond seeds 105 and the structure 101. The interface 209 may include an interface between the intermediate layer 211 and the diamond seeds 105. The interface 209 may include an interface between the intermediate layer 211 and the structure 101. In some examples, the intermediate layer 211 comprises SiN. In some examples, prior to depositing the diamond seeds 105, a surface of the structure 101 may be treated with ion implantation.

Referring to FIG. 8B, in operation 802, and as illustrated for example in operation 602E, a second plurality of diamond seeds 113 is deposited over a surface of the intermediate layer 211. The diamond seeds 113 may have an average value of thermal conductivity from about 8 W/mK to about 200 W/mK. The diamond seeds 113 may have an average diameter from about 5 nm to about 60 nm.

In some examples, at least a portion of the plurality of the diamond seeds 113 may form an interlocking interface. The interlocking interface may form as diamond crystals grow from the diamond seeds 113 to form the material 103, for example, wherein material 103 is diamond.

In operation 804, and as illustrated for example in operation 602F, a material 103 is generated over at least a portion of the resulting structure from operation 602E. For example, the material 103 is generated over at least a portion of the intermediate layer 211. In some examples, the material 103 is generated over at least a portion of the diamond seeds 113. In some examples, the material 103 is generated over at least a portion of an interlocking interface formed between two or more diamond seeds of the plurality of diamond seeds 113. In some examples, the material 103 is a carbon-containing material.

In some examples, the material 103 has an average value of thermal conductivity equal to or greater than about 1,000 W/mK. In some examples, the material 103 comprises diamond. The thermal conductivity may be measured at a temperature of about 23° C. The material 103 may have a thickness of about 1,000 micrometers (μm) or less. The material 103 may have a thickness within in a range from about 10 μm to about 600 μm. The material 103 may have a thickness of less than about 600 μm, less than about 250 μm, less than about 150 μm, less than about 100 μm or less. A surface of the material 103 may be ground or polished to reduce or eliminate surface roughness of the material 103. In some examples, the interface 209 may comprise a region having a greater amount of contact between the material 103 and the intermediate layer 211 compared to substrate 100. The interface 209 may comprise a region having a greater amount of contact between the material 103 and the structure 101 compared to interface 109. The interface 209 may comprise a region having an increased average value of thermal conductivity compared to interface 109. Compared to interface 109, comprising at least a portion of material 103 in FIG. 3, the interface 209 may comprise at least a portion of the material 103 having a higher thermal conductivity.

Referring to FIG. 7C, in operation 711, and as illustrated for example in operation 603A of FIG. 6C, a layered structure (e.g., structure 101) is provided. The structure 101 may include properties and/or elements as described herein with respect to FIG. 1-FIG. 6B. In operation 603A, an etch mask 603 is formed over at least a portion of a surface of the structure 101. The etch mask may comprise a material as described herein, for example, SiN. The etch mask 603 may comprise a pattern for etching one or more trenches into the surface of the structure 101.

In operation 713, and as illustrated for example in operation 603B of FIG. 6C, at least a portion of the surface of the structure 101 may be etched. The etching may include dry etching and may include the use of an etch mask 603. In operation 603C, the etch mask 603 may be removed. In some examples, the structure 101 may have a plurality of diamond seeds (not shown) disposed on a surface of the structure 101 and the etching may be applied around the plurality of diamond seeds instead of using an etch mask. The etching of the structure 101 may form at least part of an articulated interface 209. In some examples, the etching may form one or more trenches 607 (or troughs) within the structure 101. The articulated interface 209 may comprise one or more of the trenches 607. In some examples, an area of the interface 209 is greater than an area of interface 109.

In some examples, the etching of the structure 101 may form one or more thermal fins 609. The thermal fins 609 may be comprised of the portions of the structure 101 that are not etched (e.g., areas below and protected by the etch mask). The thermal fins 609 may, at least in part, assist in increasing an average value of thermal conductivity of a region within the interface 209 compared to interface 109.

In some examples, a plurality of diamond seeds (not shown) may be disposed over an etched surface of the structure resulting from operation 603C. The plurality of diamond seeds may have diameters and thermal conductivities similar to diamond seeds 105. One or more of the diamond seeds may be disposed in one or more of the trenches formed in the etched structure 101.

In operation 717, and as illustrated for example in operation 603F, a material 103 may be generated over at least a portion of the resulting structure from operation 603C.

In some examples, operation 717 may include the deposition of a second plurality of diamond seeds 113 over a surface of the structure resulting from operation 603C.

Referring to FIG. 7D, in operation 715, and as illustrated for example in operation 603D of FIG. 6C, an intermediate layer 211 may be generated, grown, or deposited over at least a portion of a surface of the resulting structure from operation 603C. In some examples, the intermediate layer 211 comprises SiN.

In some examples, the material 103 may be generated over at least a portion of the intermediate layer 211. The material 103 may be generated over at least a portion of diamond seeds 113, for example, when the diamond seeds 113 have been deposited over a portion of the intermediate layer 211 as shown in operation 603E. The diamond seeds 113 may have an average value of thermal conductivity from about 8 W/mK to about 200 W/mK. The diamond seeds 113 may have an average diameter from about 5 nm to about 60 nm. In some examples, at least a portion of the plurality of the diamond seeds 113 may form an interlocking interface. The interlocking interface may form as diamond crystals grow from the diamond seeds 113 to form the material 103, for example, wherein material 103 is diamond.

In some examples, the material 103 is generated over at least a portion of an interlocking interface formed between two or more diamond seeds (e.g., diamond columns from the diamond seeds) of the plurality of diamond seeds 113. In some examples, the material 103 is a carbon-containing material. In some examples, the material 103 has an average value of thermal conductivity equal to or greater than about 1,000 W/mK. In some examples, the material 103 comprises diamond.

Figure 9A:
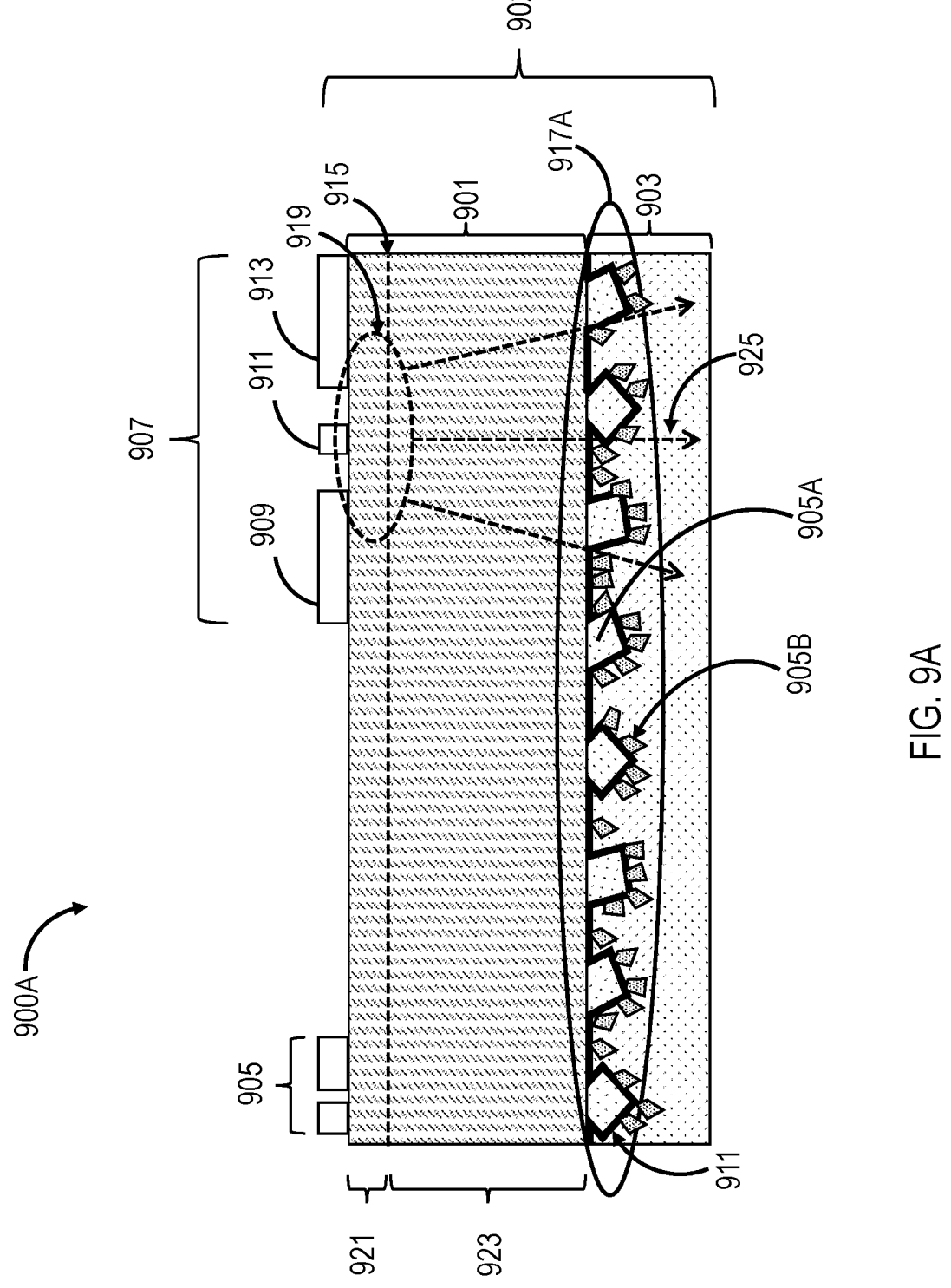
FIG. 9A illustrates a cross-sectional view of an example substrate, in accordance with some embodiments disclosed herein.
Figure 9B:
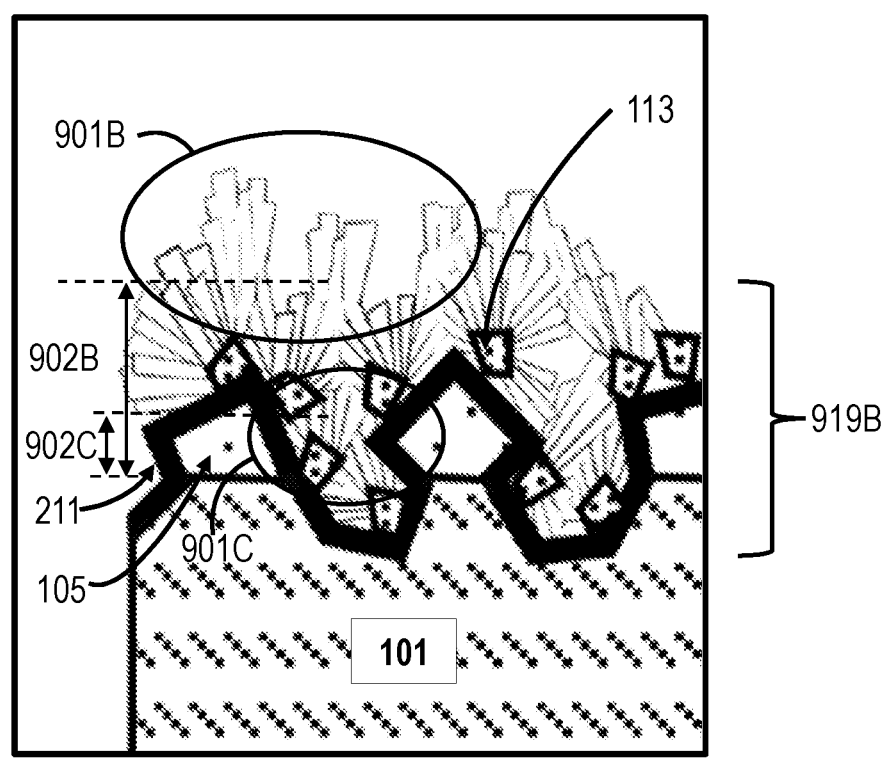
FIG. 9B illustrates a cross-sectional view of an example substrate, in accordance with some embodiments disclosed herein.

FIG. 9A illustrates a cross-sectional view of an example substrate 900A, in accordance with some embodiments disclosed herein. In some examples, the substrate 900A is a compound semiconductor-containing substrate. The substrate 900A may include properties and/or elements similar to substrate 100, substrate 200 or the substrate illustrated in FIG. 3, FIG. 6A or FIG. 6B. Substrate 900A may comprise a monolithically integrated microwave or millimeter-wave circuit (MMIC), such as a MMIC chip 902. In some examples, the chip 902 can comprise a structure 901 that includes at least one layer of a wide-bandgap semiconductor material. The structure 901 may include similar properties and/or elements to the layered structure 101. The wide-bandgap semiconductor material may be single-crystalline. The substrate 900 may also include at least one layer of material 903. The material 903 may include similar properties and/or elements to the material 103. The substrate 900 may also include a plurality of diamond seeds 905A. The plurality of diamond seeds 905A may include similar properties and/or elements to the plurality diamond seeds 105. The substrate 900 may also include a second plurality of diamond seeds 905B. The second plurality of diamond seeds 905B may include similar properties and/or elements to the plurality diamond seeds 113. The substrate 900 may also include an intermediate layer 911. The intermediate layer 911 may include similar properties and/or elements to the intermediate layer 111 or the intermediate layer 211.

The chip 902 may be attached to a package base (not shown), for example, below the material 103. The chip 902 may comprise electrical connections, a passive circuit 905 and an active circuit 907 disposed on a surface of the layered structure 901. Active circuit 907 may be a transistor, as described herein, and may comprise a source 909, gate 911, and drain 913 terminals disposed on structure 901. The structure 901 may include a two-dimensional electron gas layer or source (2DEG) 915, which may be embedded within the structure 901.

The substrate 900 may comprise the interface 917A. The interface 917A may include similar properties and/or elements to the interface 109 or interface 209. The interface 917A may include an interface between the material 903 the structure 901. The interface 917A may include an interface between the diamond seeds 905 and the structure 901. The interface 917A may include an interface between the diamond seeds 905 and the intermediate layer 911. The interface 917A may include an interface between the material 903 the intermediate layer 911. The interface 917A may include an interface between the structure 901 and the intermediate layer 911.

The intermediate layer 911 may be a tacking layer configured to tack the diamond seeds 905A to a surface of the structure 901. In some examples, at least a portion of the plurality of diamond seeds 905B may form an interlocking interface. The interlocking interface may form as diamond crystals grow from the diamond seeds 905B to form the material 903, for example, wherein material 903 is diamond. Diamond crystals may form in a plurality of columns that each grow in a direction away from each of the plurality of diamond seeds 905B, as described herein. An interlocking interface may assist, at least in part, in increasing an average value of thermal conductivity of a region of the interface 917A and may also reduce an average value of thermal boundary resistance of a region of the interface 917A and may increase an average value of adhesion strength of the material 903 to the structure 901 (e.g., adhesion strength of the interface between the material 903 and structure 901, such as interface 917A). An interlocking interface may also comprise at least a portion of the material 901 that is formed in one or more trenches of an articulated interface (e.g., similar to interface 209). The interface 917A may comprise one or more of such trenches comprising the material 901 (e.g., not shown in FIG. 9A), which may improve adhesion strength of interface 917A.

In some examples, the interface 917A may comprise an interlocking interface. The interlocking interface may assist in nucleating the growth of the material 903. The interlocking interface may comprise at least a portion of the intermediate layer 911. The interface 917A may comprise properties similar to the articulated interface 209.

Transistor 907 may use a voltage applied between the gate 911 and the source 909 to control the current flowing along the 2DEG 915 between the source 909 and the drain 913. The region 919 of the 2DEG where the gate voltage controls the current is below the gate 911. A barrier layer 921, a buffer layer 923 or both may be adjacent to the 2DEG and together they may form the structure 901.

During the operation of transistor 907, heat may be generated in the region 919 (e.g., active region). Generally, a transistor's thermal efficiency can be limited by its ability to conduct heat away from an active region to the transistor's substrate and external environment. For example, the thermal efficiency of transistor 907 may depend at least in part on the ability of the chip 902 to conduct heat away from region 919 through the structure 901 and the material 903. The chip 902 may conduct heat away from the region 919 to an external environment, e.g., via the layered structure 901, the material 903 and a package base (not shown). Heat may additionally transfer from a package base into a heat conducting element (not shown). The heat spreading and direction of flow is indicated with arrows 925. One objective of an efficient transistor-chip thermal design may include reducing thermal resistance between a heat source (e.g., region 919) and a package base. Thermal resistance may be defined as a difference between a peak temperature of a heat generating region 919 and an average temperature of a back surface of a package base, divided by the power dissipated during normal operation. The chip 902 may provide reduced thermal resistance between the region 919 and a package base (not shown). The reduced thermal resistance may be due at least in part to the properties of interface 917A.

FIG. 9B illustrates a cross-sectional view of an example substrate 900B, in accordance with some embodiments disclosed herein. In some examples, the substrate 900B is a compound semiconductor-containing substrate. The substrate 900B may include properties and/or elements similar to substrate 100, substrate 200 or the substrate illustrated in FIG. 3, FIG. 6A, FIG. 6B or FIG. 9A. In some examples, FIG. 9B illustrates a magnified view of the growth of material 103 or 903. In some examples, FIG. 9B illustrates a magnified view of diamond growth. Substrate 900B may include the structure 101, a plurality of diamond seeds 105, a second plurality of diamond seeds 113, and an intermediate layer 211. In some examples, FIG. 9B illustrates an interface 919B including properties and/or elements similar to interface 109, 209 or 917A.

In some examples, at least a portion of the plurality of the diamond seeds 113 may form an interlocking interface. The interlocking interface may form, for example, as diamond crystals grow from the diamond seeds 113 to form the material 103. In some examples, the material 103 is diamond. Diamond crystals may form in a plurality of columns that each grow in a direction away from each of the plurality of diamond seeds 113. As illustrated in region 901B, in some examples, one or more diamond crystal columns may grow from an individual diamond seed of the plurality of diamond seeds 113. Two or more diamond crystal columns (e.g., each from separate diamond seeds) may grow into one another, coalescing at a distance 902B from a surface of the structure 101. The coalescing at distance 902B may occur, at least in part, because the plurality of diamond seeds 113 are disposed across the structure 101 (e.g., across the intermediate layer 211 and the diamond seeds 105) at distances (e.g., in a vertical or horizontal plane) between each of the plurality of diamond seeds 113 that allow for coalescing of the individual diamond columns at an early stage of diamond growth. Additionally, such coalescing at distance 902B may occur, at least in part, because the diamond seeds 113 are disposed at varied distances from a surface of the structure 101. In some examples, at least one diamond column growing from a first diamond seed of the plurality of diamond seeds 113 and at least one diamond column growing from a second diamond seed of the plurality of diamond seeds 113 coalesce at a distance from a surface of the semiconductor structure (e.g., distance 902B, 902C). In some examples, the distance may be from about 10 nm to about 1,000 micrometers.

In some examples, two or more diamond crystal columns may coalesce at a location below a surface of the structure 101, such as within a trench. For example, when the interface 919B includes an articulated interface. The articulated interface may be formed according to the methods described herein, for example, by etching at least a portion of a surface of the structure 101. In some examples, an articulated interface may be formed by depositing the diamond seeds 105 over at least a portion of a surface of the structure 101.

In some examples, the diamond columns may coalesce at a distance 902B that is closer to the surface of the structure 101 compared to a substrate not comprising the diamond seeds 105. Coalescing of the diamond columns may assist in increasing an average value of thermal conductivity of a region of the interface 919B of the substrate 900B. In some examples, the interface 919B may comprise an articulated interface (e.g., similar to interface 209), wherein the articulated interface may comprise at least a portion of the plurality of diamond seeds 113 having diamond columns that coalesce (e.g., illustrated in region 901C) at a distance 902C that is closer to a surface of the structure 101 than distance 902B.

In some examples, wherein the interface 919B comprises an articulated interface, a crystal grain size (e.g., diameter) of a diamond crystal column may be larger at a distance (e.g., 901B or 901C) from a surface of the structure 101 than a substrate interface without an articulated interface. The thermal conductivity of diamond may be proportional to its crystal grain size. In some examples, a larger crystal grain size of a diamond column closer to the substrate interface 919B may result in an increased thermal conductivity of the diamond (e.g., material 103). In some examples, a larger crystal grain size of a diamond column closer to the substrate interface 919B may result in a decreased thermal boundary resistance of the interface 919B.

Figure 10:
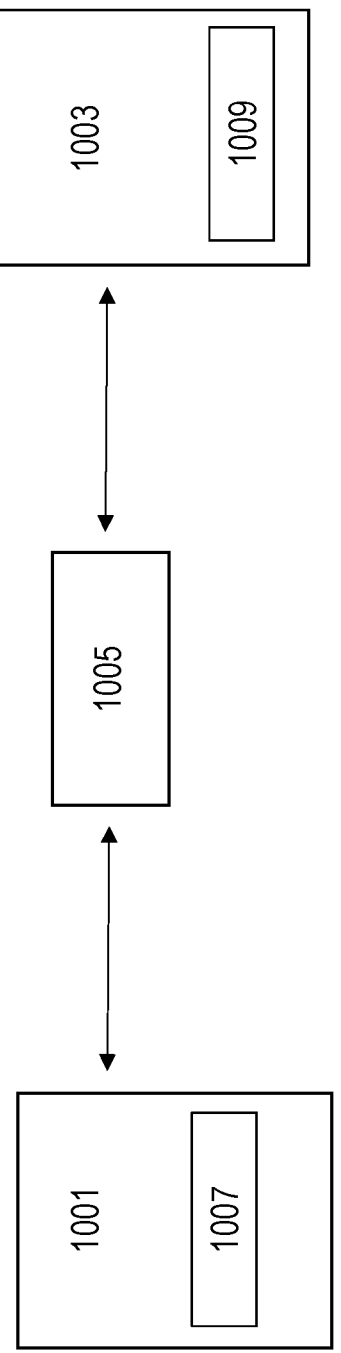
FIG. 10 illustrates a block diagram of an example system including one or more devices comprising a compound semiconductor substrate, in accordance with some embodiments disclosed herein.

FIG. 10 illustrates a block diagram of an example system 1000 including one or more devices that comprise a semiconductor-containing substrate, in accordance with some embodiments disclosed herein. System 1000 may be a wireless system, for example, a wireless communication system (e.g., radio-frequency (RF), microwave, free-space optical) or a wireless power transfer system. System 1000 includes device 1001, device 1003 and link 1005. Device 1001 and device 1003 may be configured to communicate wirelessly over link 1005. Link 1005 may comprise wireless communications (e.g., electromagnetic signals) between device 1001 and device 1003 and may be characterized by parameters including path loss. In examples where system 1000 is not a wireless system, link 1005 may be a cable (e.g., electrical conductor or optical fibers). Device 1001, device 1003, or both may include circuitry or components comprising substrates similar to substrate 100, substrate 200 or the substrate illustrated in FIG. 3, FIG. 6A or FIG. 6B, or other substrates manufactured according to the methods described herein. By comprising such substrates, devices 1001 and 1003 may provide improvements in wireless communications through, at least, improved device thermal efficiencies and power-added efficiencies (PAE).

Device 1001 may include a transmitter 1007 for transmitting electromagnetic signals to device 1003. Device 1003 may include a receiver 1009 for receiving electromagnetic signals from device 1001. Transmitter 1007 may be an RF or microwave transmitter, including transmitting circuitry configured to be communicatively coupled to one or more antennas, for transmitting RF or microwave signals over link 1005 to device 1003. In some examples, transmitter 1007 may be an optical transmitter, communicatively coupled to optical transmitting circuitry and components, for transmitting optical signals over link 1005 to device 1003. Receiver 1009 may be an RF or microwave receiver, including receiving circuitry configured to be communicatively coupled to one or more antennas, for receiving RF or microwave signals over link 1005 from device 1001. Device 1001 and device 1003 may also include circuitry configured for both transmitting and receiving functions (e.g., transceiver).

Device 1001 and device 1003 may also include components such as processor(s), memory, input device(s), output controller(s), signal generation device(s), network interface device(s), sensor(s), and power source(s), which some or all may communicate with each other via an interlink (e.g., bus). Device 1001 and device 1003 may be terrestrial or aerial devices and may be stationary or mobile. Nonlimiting examples of stationary devices include, for example, land stations (e.g., base station, node, access point) or ground stations (e.g., earth station, terminal, gateway). Nonlimiting examples of mobile devices include, for example, vehicular devices, aerial devices, or mobile client devices. Device 1001 or device 1003 (or both) may be a satellite, such as a cubesat or a microsat.

System 1000 may be part of, or may be configured for communication with, a wireless network such as a satellite network, a cellular network or a noncellular network. A satellite network can include, for example, a Low Earth Orbit (LEO) satellite network, a Geostationary (GEO) satellite network or a Medium Earth orbit (MEO) satellite network. A noncellular network can include, for example, a local area network (LAN), a wide area network (WAN) or a packet data network. A cellular network (e.g., radio access network) can include, for example, a 3rd Generation Partnership Project (3GPP) Long Term Evolution (LTE), 5th Generation (5G) New Radio, or Internet-of-Things (IoT) network. A network may include network devices, such as routing apparatuses, network routers or network switches (not shown). Device 1001 and device 1003 may be configured to use or interface with one or more communication protocols, for example, Digital Video Broadcasting-Satellite (DVB-S) protocol, Consultative Committee for Space Data Systems (CCSDS) protocol, Transmission Control Protocol/ Internet Protocol (TCP/IP), Institute of Electrical and Electronics Engineers (IEEE) protocols, 3GPP, 5G and European Telecommunications Standards Institute (ETSI) protocols.

Figure 11:
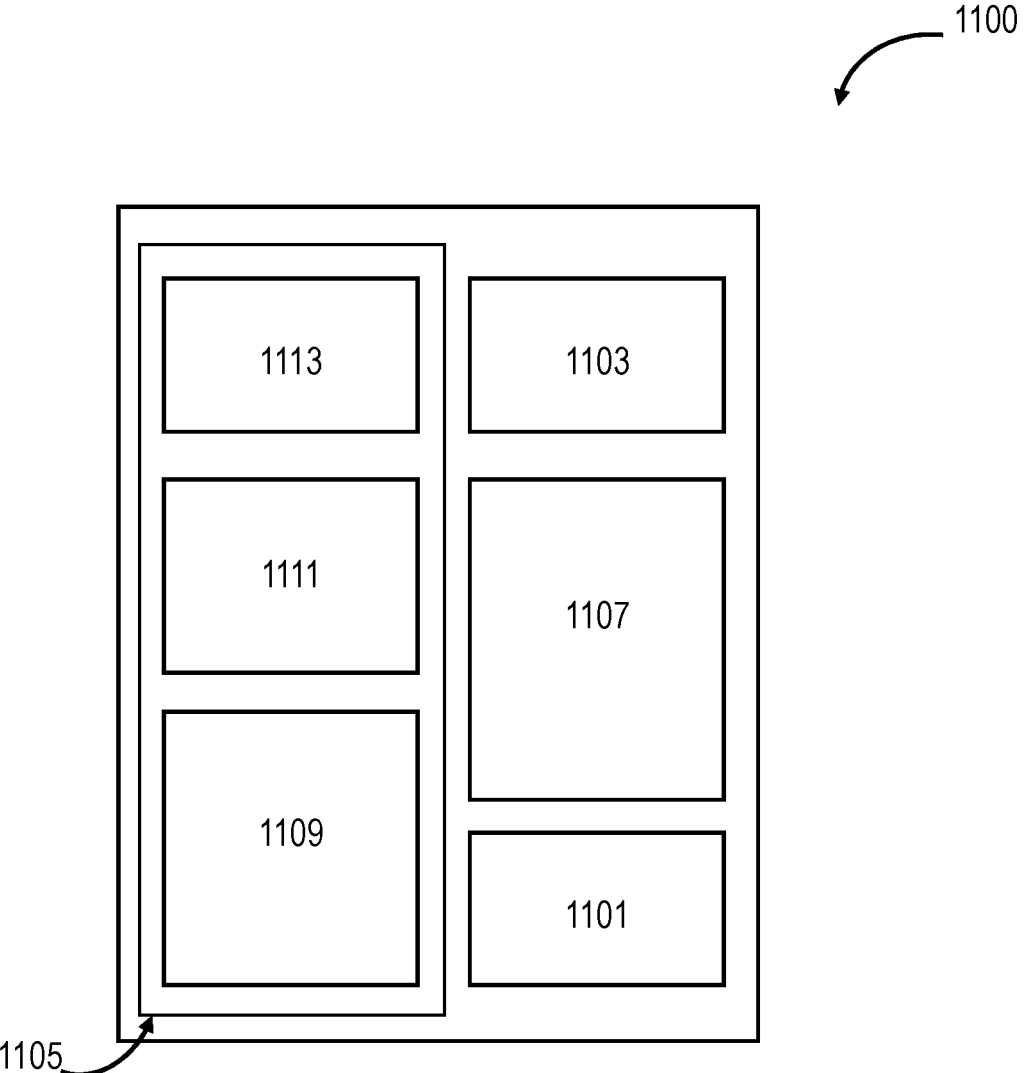
FIG. 11 illustrates a block diagram of an example wireless device, in accordance with some embodiments disclosed herein.

FIG. 11 illustrates a block diagram of an example wireless device 1100, in accordance with some embodiments disclosed herein. Device 1100 may include similar properties and/or elements to device 1001 or device 1003. Device 1100 may include circuitry or components comprising substrates similar to substrate 100, substrate 200 or the substrate illustrated in FIG. 3, FIG. 6A or FIG. 6B, or other substrates manufactured according to the methods described herein. Aspects may include or operate by logic, components, or mechanisms in device 1100. Circuitry may be defined as a collection of circuits implemented in tangible entities of device 1100, including hardware (e.g., simple circuits, gates, logic). Circuitry of device 1100 can include components that are configured to perform the operations of the methods described herein. Circuitry of device 1100 may be hardwired (e.g., hardware circuitry of device 1100) to carry out the operations. Hardware circuitry of device 1100 may include communicatively coupled physical components (e.g., execution components, transistors, simple circuits) including a machine-readable or computer-readable medium that may be physically modified (e.g., magnetically, electrically) to encode instructions of the operations.

In one aspect, device 1100 is a satellite (e.g., cubesat, microsat), for example, within a satellite communication network. Device 1100 may comprise energy block 1101, which may comprise one or more solar cells and a battery, a waste heat radiator 1103, a control-communications block 1105, and a payload 1107. Device 1100 may include additional components which are not shown. In some examples, the payload 1107 may include sensing, measurement, or imaging instrumentation. The control-communications block 1105 may comprise a transmitter 1109, a receiver 1111, and control circuitry 1113 (e.g., for managing control functions of the components of device 1100). The components of the device 1100 may be communicatively coupled via an interlink (e.g., bus).

Transmitter 1109 may be an RF or microwave transmitter, including transmitting circuitry configured to be communicatively coupled to one or more antennas, for transmitting RF or microwave signals over a wireless link to another device (e.g., another satellite, ground station). Receiver 1111 may be an RF or microwave receiver, including receiving circuitry configured to be communicatively coupled to one or more antennas, for receiving RF or microwave signals over a wireless link from another device (e.g., ground station or another satellite). In some examples, transmitter 1109 may comprise a MMIC chip. Transmitter 1109 (or receiver 1111) may include circuitry or components comprising substrates similar to substrate 100, substrate 200 or the substrate illustrated in FIG. 3, FIG. 6A or FIG. 6B, or other substrates manufactured according to the methods described herein.

Such substrates contribute to efficient thermal management and improved PAE of the device 1100. Energy consumption (e.g., subsequent heat dissipation) of transmitter 1109 may increase with a data transfer rate according to the Shannon-Hartley theorem. A minimum size of device 1100 may be determined by dimensions of transmitter 1109 and whether device 1100 can produce sufficient power to operate the transmitter 1109. This in turn can be a determining factor in a link budget. For example, power dissipated in the transmitter 1109 may be greater than a sum of powers dissipated in the control circuitry 1113 and the receiver 1111 combined, particularly if the device 1100 is configured to communicate in a high-frequency band (e.g., mmWave, K-band).

Figure 12:
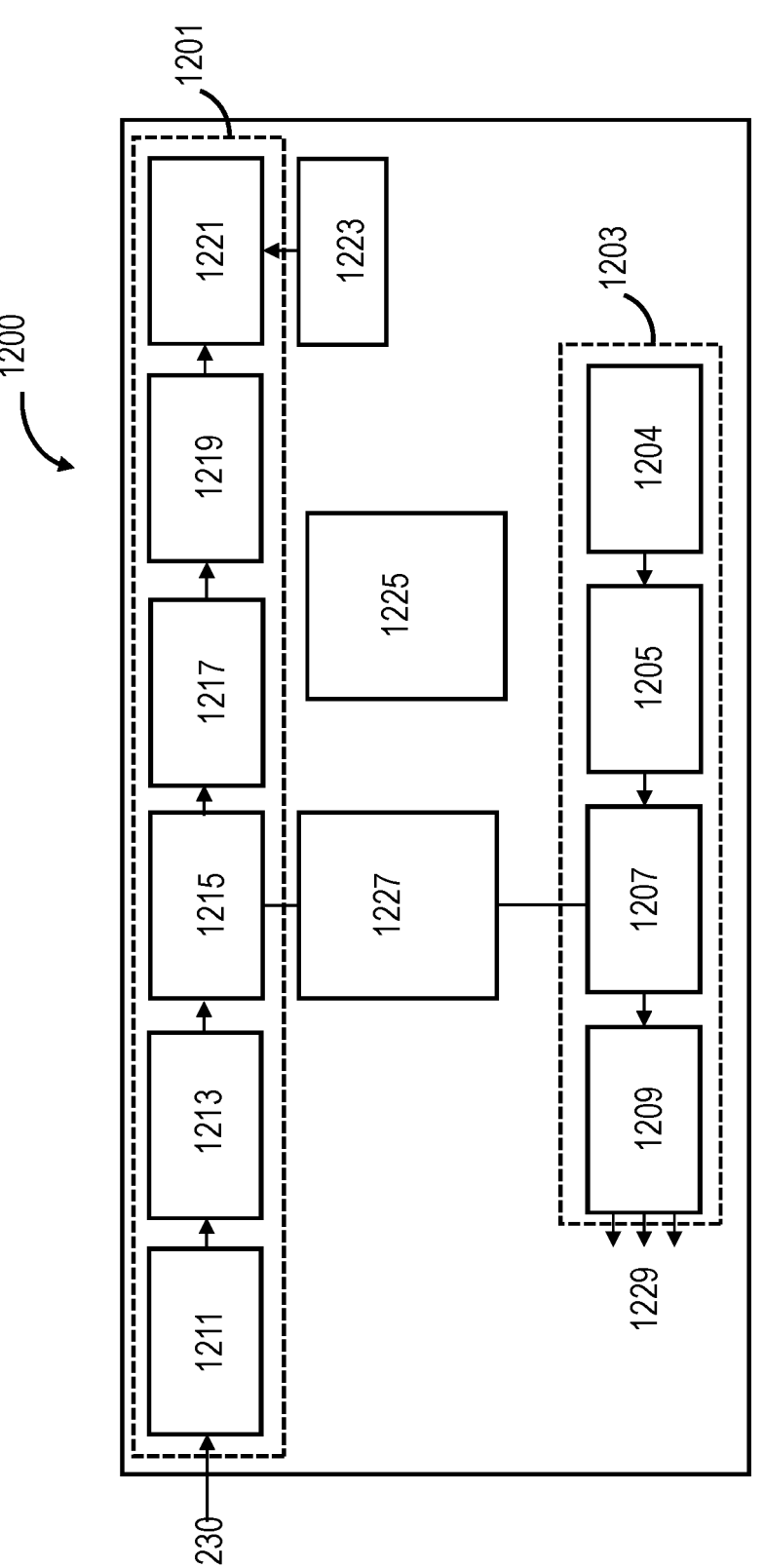
FIG. 12 illustrates a block diagram of an example control-communications block of a wireless device, in accordance with some embodiments disclosed herein.

FIG. 12 illustrates a block diagram of an example control-communications block 1200 of a wireless device, in accordance with some embodiments disclosed herein. Control-communications block 1200 may include similar properties and/or elements to control-communications block 1105 and may include additional components not shown in FIG. 12. Control-communications block 1200 may include circuitry or components comprising substrates similar to substrate 100, substrate 200 or the substrate illustrated in FIG. 3, FIG. 6A or FIG. 6B, or other substrates manufactured according to the methods described herein. Control-communications block 1200 may include transmitting circuitry (e.g., transmitting circuitry 1201), configured to be communicatively coupled to one or more antennas, for transmitting RF or microwave signals. Control-communications block 1200 may also include receiving circuitry (e.g., receiving circuitry 1203) configured to be communicatively coupled to one or more antennas, for receiving RF or microwave signals. In some examples, the receiving circuitry 1203 may comprise a radio front end of a device, such as device 1100.

The receiving circuitry 1203 can include a low-noise amplifier (LNA) 1204, a bandpass filter 1205, a frequency downconverter 1207, and a demodulator 1209. The output of the receiving circuitry 1229 may be transmitted to a modulator or an on-board computer (OBC) (not shown). In some examples, the receiving circuitry 1203 may have additional components, not shown in FIG. 12. The transmitting circuitry 1201 can include a modulator 1211, a low-pass filter (e.g., anti-aliasing filter (AAF)) 1213, a mixer 415, a band-pass filter 417, a variable gain amplifier 1219 (e.g., including a gain-commanding function), and a power amplifier (e.g., solid-state power amplifier SSPA) 1221. In some examples, the transmitting circuitry 401 may have additional components not shown in FIG. 12. Control-communications block 1200 may also include a sequence generator 1223, DC power conditioning circuitry 1225 and frequency synthesis circuitry 1227, which may include a local oscillator (LO) or LO function. Some or all of the components shown in control-communications block 1200 (including those not shown) may communicate with each other via an interlink (e.g., bus) (not shown).

In some examples, the receiving circuitry 1203 may receive an RF signal (e.g., from an antenna of the device 1100). The received RF signal may be transmitted from a ground station or another device (e.g., satellite). The LNA 1204 may amplify the received RF signal, the bandpass filter 1205 may filter the signal to a frequency of interest, the frequency downconverter 1207 may down-convert the filtered RF signal to another frequency (e.g., as used by the frequency synthesis circuitry 1227) for processing of the signal (e.g., removing an RF carrier wave signal to produce an intermediate frequency (IF) signal for processing), and the demodulator 1209 may decode the down-converted signal to extract an information-bearing signal.

In some examples, the transmitting circuitry 1201 may prepare a signal (e.g., RF signal, satellite signal) for transmission to another device (e.g., satellite, ground station).

The modulator 1211 may produce an analog baseband information signal from a digital information signal (e.g., provided by another component and input at 1230). The low-pass filter or AAF 1213 may filter the analog signal to remove aliasing from the digital-to-analog conversion. The mixer 1215 may prepare the signal for transmission on an RF carrier wave by mixing the analog baseband signal with an RF signal, for example, an RF signal provided by the frequency synthesis circuitry 1227. The bandpass filter 1217 may filter the resulting RF information signal to a transmission frequency of interest and variable gain amplifier 1219 may provide the RF information signal at a specified gain to an input of the SSPA 1221. The SSPA 1221 may amplify the RF information signal for transmission by one or more antennas of the device (e.g., device 1100). In some examples, the SSPA 1221 may comprise a MMIC chip. The sequence generator 1223 may generate sequences for the input of the SSPA 1221. For example, the sequence generator 1223 may generate a sequence (e.g., at a specified voltage) for the gate terminal of the MMIC chip and a sequence for the drain terminal of the MMIC chip. DC power conditioning circuitry 1225 may convert a battery supply voltage (e.g., a voltage provided by energy block 1101) to a bias voltage for the components of the control-communications block 1200.

Figure 13:
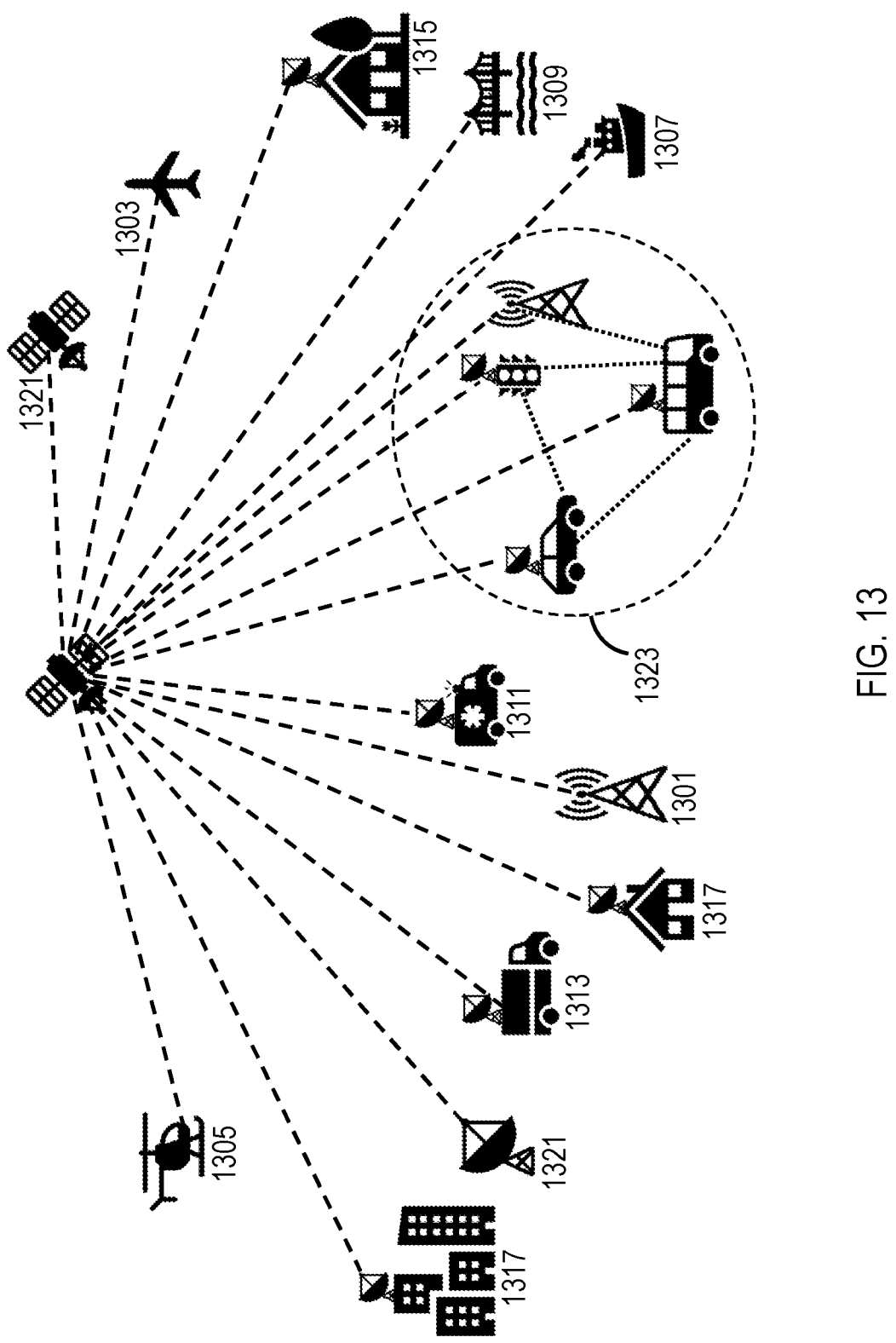
FIG. 13 illustrates a block diagram representing various examples of wireless communication networks, in accordance with some embodiments disclosed herein.

FIG. 13 illustrates a block diagram representing various example wireless communication networks 1300, in accordance with some embodiments disclosed herein. In some examples, FIG. 13 illustrates various applications of devices that comprise circuitry or components comprising substrates similar to substrate 100, 200, 900, or other substrates manufactured according to the methods described herein. Such devices may operate with greater thermal efficiency and power added efficiency (PAE) in comparison to alternative devices that do not include such substrates. Such devices can provide improved RF performance and increased network capacity compared to alternative devices, while reducing a need for complex thermal control systems. Applications of such devices can include, but are not limited to, cellular backhaul over satellite 1301, aeronautical satellite communications (e.g., internet over satellite for aviation 1303, emergency and safety 1305), maritime satellite communications 1307, infrastructure monitoring 1309, land-based emergency and disaster relief 1311, highly-distributed networks 1313 (e.g., asset tracking), network connectivity alternatives for remote areas 1315 or urban areas 1317a and 1317b, satellite communications (e.g. satellite to satellite 1321 and ground station to satellite 1325a and 1325b), and IoT networks 1323. FIG. 13 does not fully illustrate each and every network link or device within each of the aforementioned wireless communication network applications. For each application, additional wireless and/or wired links and devices may be present in a network.

The devices described herein (e.g., 1001, 1003) may be satellite communications devices (e.g., satellites) capable of operating at many different frequencies and communication bands as part of a satellite communication system. For example, such devices may operate in an L-band frequency range (e.g., 1-2 GHz), S-band frequency range (e.g., 2-4 GHz), C-band frequency range (e.g., 4-8 GHz), X-band frequency range (e.g., 8-12 GHz), K-band frequency range (e.g., 17-20 GHz (Ku/K-bands), 37-40 GHz (Ka-bands)), a V-band frequency range (e.g., 40-75 GHz), W-band frequency range (e.g., 75-110 GHz), mm-wave band frequency range, G-band frequency range (e.g., 110-300 GHz), E-band frequency range (e.g., 60-90 GHz), or other frequency ranges.

In some examples, a device is a satellite that may be configured to operate in a Ka-band at a frequency in a range from about 18.3 GHz to about 20.2 GHz (e.g., 18.3 GHz). The satellite may be positioned, as part of a satellite constellation, at an altitude between about 400 km and about 600 km (e.g., 500 km). The satellite may transmit communications signals at an RF power of about 10 W, 20 W or 50 W (e.g., 10 W) and may have a noise power ratio between about 15 dB to about 30 dB (e.g., 30 dB). At least one antenna may be communicatively coupled to the satellite. The antenna may have a cross-polarization isolation (XPI) of 22 dB. The antenna may have a diameter in a range from about 0.45 meters to about 1.2 meters (e.g., 0.5 meters). The antenna may have a diameter in a range from about 2 meters to about 5 meters. The antenna may have an efficiency of about 0.45. The antenna may have a gain of about 36.16 dBi. Antenna gain may be influenced by factors such as antenna efficiency, antenna diameter and the wavelength of the transmitted signal. The pointing error may be about 1.0 degrees. For these values, the transmitter may transmit with an EIRP of about 43.88 dBW.

In some examples, an elevation angle (e.g., between the satellite and a horizontal plane) may be a value in a range from about 15 degrees to about 25 degrees (e.g., 20 degrees). The path length may be about 1193 km. In some examples, free space path loss may be about 179.22 dB. Atmospheric gas losses may be about 1.5 dB or within a range from about 0 dB to about 10 dB. The expected loss due to rain fade may be about 20 dB. The total propagation loss can include the sum of the free space path loss and the environmental losses, such as atmospheric gas losses and rain fade, and may equal about 200.72 dB. The gain at the receiver contributes to the strength of the signal and may be dependent on the geometry of the receiver antenna. The diameter of the receiver antenna may be in a range from about 10 meters to about 20 meters (e.g., 13.2 meters). In such example, the antenna efficiency may be about 0.6 and the antenna gain may be about 65.84 dBi.

The receiver may also introduce signal loss. The pointing loss at the receiver may be about 0.2 dB. The XPI loss may be about 25 dB. The temperature of the antenna may be about 75 K. The receiver low noise amplifier (LNA) noise figure may be about 2 dB. The LNA noise effective temperature may be about 169.62 K, which may be influenced by noise factor. The feeder operating temperature may be about 300 K. The feeder and input filter loss may be about 1 dB. The effective system noise temperature may be about 290.90 K. The receiver gain over temperature may be about 40.01 dB/K. In some examples, the satellite may be allocated a bandwidth of about 1200 MHz. The roll-off factor for the transmitter may be about 0.1. The roll-off factor may be between about 0 and about 0.4. The symbol rate may be about 1090.91 Msym/sec. Using a modulation scheme of 128 APSK, the symbol rate may correspond to 7 bits per symbol. The code rate may be about 0.8. The overhead may be about 0.1. The sums of the gains and losses at the transmitter and receiver may total about −102.2 dB. For a transmitter power of 10 dBW, a carrier signal power may be about −92.2 dBW. The noise signal may be about −113.58 dBW and may be influenced by the noise temperature and the symbol rate. The carrier-to-noise ratio (CNR) may be about 21.39 dBm, which may vary when losses from XPI and noise power ratio are considered (e.g., 17.51 dB). The Shannon capacity may be about 7.01 Gbps. In some examples, the Shannon capacity may be about 5.05 Gbps, for example, when coding and overhead are considered. The dB factor away from Shannon may be 3 dB. The data rate may be about 5.84 Gbps. Data rate may be influenced by factors such as bandwidth, CNR and the dB factor in linear space. Accounting for coding and overhead, the data rate may be about 4.21 Gbps.

In another example, a device is a satellite that may be configured to operate at a frequency of about 42 GHz. The satellite may be positioned, as part of a satellite constellation, at an altitude between about 400 km and about 600 km (e.g., 500 km). The satellite may transmit communications signals at an RF power of about 5 W, 10 W, 20 W or 50 W (e.g., 5 W) and may have a noise power ratio between about 15 dB to about 30 dB (e.g., 15 dB). At least one antenna may be communicatively coupled to the satellite. The antenna may have a cross-polarization isolation (XPI) of about 22 dB. The antenna may have a diameter in a range from about 0.45 meters to about 1.2 meters (e.g., 0.5 meters). The antenna may have a diameter in a range from about 2 meters to about 5 meters. The antenna may have an efficiency of about 0.45 and a gain of about 43.4 dBi. The pointing error may be about 1.0 degrees. For these values, the transmitter may transmit with an EIRP of about 47.37 dbW.

In some examples, an elevation angle (e.g., between the satellite and a horizontal plane) may be a value in a range from about 15 degrees to about 25 degrees (e.g., 20 degrees). The path length may be about 1193 km. In some examples, free space path loss may be about 86.44 dB. Atmospheric gas losses may be about 1.5 dB or within a range from about 0 dB to about 10 dB. The expected loss due to rain fade may be about 20 dB. The total propagation loss can include the sum of the free space path loss and the environmental losses, such as atmospheric gas losses and rain fade, and may equal about 212.94 dB. The gain at the receiver contributes to the strength of the signal and may be dependent on the geometry of the receiver antenna. The diameter of the receiver antenna may be about 12 meters or may be within a range from about 10 meters to about 20 meters. In such example, the antenna efficiency may be about 0.6 and the antenna gain may be about 72.23 dBi.

The receiver may also introduce signal loss. The pointing loss at the receiver may be about 0.2 dB. The XPI loss may be about 25 dB. The temperature of the antenna may be about 75 K. The receiver low noise amplifier (LNA) noise figure may be about 2 dB. The LNA noise effective temperature may be about 169.62 K and may be influenced by factors including noise factor. The feeder operating temperature may be about 300 K. The feeder and input filter loss may be about 1 dB. The effective system noise temperature may be about 290.90 K. The receiver gain over temperature may be about 46.39 dB/K. In some examples, the satellite may be allocated a bandwidth of about 2000 MHz. The roll-off factor for the transmitter may be about 0.1. The roll-off factor may be between about 0 and about 0.4. The symbol rate may be about 1818.18 Msym/sec. Using a modulation scheme of 128 APSK, the symbol rate may correspond to 7 bits per symbol. The code rate may be about 0.8. The overhead may be about 0.1. The sums of the gains and losses at the transmitter and receiver may total about −101.53 dB. For a transmitter power of 10 dBW, a carrier signal power may be about −94.54 dBW. The noise signal may be about −111.37 dBW and may be influenced by such factors as the noise temperature and the symbol rate. The CNR may be about 16.82 dB, which may vary when losses from XPI and noise power ratio are considered. The Shannon capacity may be about 8.2 Gbps. In some examples, the Shannon capacity may be about 5.91 Gbps, for example, when coding and overhead are considered. The dB factor away from Shannon may be 3 dB. The data rate may be about 6.37 Gbps. Accounting for coding and overhead, the data rate may be about 4.59 Gbps.

In another example, a device is a satellite that may be configured to operate at a frequency of about 42 GHz. The satellite may be positioned, as part of a satellite constellation, at an altitude between about 5000 km and about 7000 km (e.g., 6000 km). The satellite may transmit communications signals at an RF power of about 5 W, 10 W, 20 W or 50 W (e.g., 5 W) and may have a noise power ratio between about 15 dB to about 30 dB (e.g., 30 dB). The XPI may be about 22 dB. The antenna may have a diameter in a range from about 0.45 meters to about 1.2 meters (e.g., 0.5 meters). The antenna may have a diameter in a range from about 2 meters to about 5 meters. The antenna may have an efficiency of about 0.45. The antenna may have a gain of about 43.4 dBi. The pointing error may be about 1.0 degrees. For these values, the transmitter may transmit with an EIRP of 47.37 dBW.

In some examples, an elevation angle (e.g., between the satellite and a horizontal plane) may be a value in a range from about 15 degrees to about 25 degrees (e.g., 20 degrees). The path length may be about 1193 km. In some examples, free space path loss may be about 86.44 dB. Atmospheric gas losses may be about 1.5 dB or within a range from about 0 dB to about 10 dB. The expected loss due to rain fade may be about 25 dB (e.g., heavy rain). The total propagation loss can include the sum of the free space path loss and the environmental losses, such as atmospheric gas losses and rain fade, and may equal about 230.15 dB. The gain at the receiver contributes to the strength of the signal and may be dependent on the geometry of the receiver antenna. The diameter of the receiver antenna may be in a range from about 10 meters to about 20 meters (e.g., 12 meters). In such example, the antenna efficiency may be about 0.6 and the antenna gain may be about 72.23 dBi.

The receiver may also introduce signal loss. The pointing loss at the receiver may be about 0.2 dB. The XPI loss may be about 25 dB. The temperature of the antenna may be about 75 K. The receiver low noise amplifier (LNA) noise figure may be about 2 dB. The LNA noise effective temperature may be about 169.62 K. The feeder operating temperature may be about 300 K. The feeder and input filter loss may be about 1 dB. The effective system noise temperature may be about 290.90 K. The receiver gain over temperature may be about 46.39 dB/K. In some examples, the satellite may be allocated a bandwidth of about 250 MHz. The roll-off factor for the transmitter may be about 0.1. The roll-off factor may be between about 0 and about 0.4. The symbol rate may be about 227.27 Msym/sec. Using a modulation scheme of 128 APSK, the symbol rate may correspond to 7 bits per symbol. The code rate may be about 0.8. The overhead may be about 0.1. The sums of the gains and losses at the transmitter and receiver may total about −118.74 dB. For a transmitter power of 10 dBW, a carrier signal power may be about −111.75 dBW. The noise signal may be about −120.40 dBW. The CNR may be about 8.65 dB, which may vary when losses from XPI and noise power ratio are considered (e.g., 8.33 dB). The Shannon capacity may be about 0.74 Gbps. In some examples, the Shannon capacity may be about 0.53 Gbps, for example, when coding and overhead are considered. The dB factor away from Shannon may be 3 dB. The data rate may be about 0.54 Gbps. Accounting for coding and overhead, the data rate may be about 0.39 Gbps In one example, a device is a satellite that may be configured to operate in a Ka-band at a frequency in a range from about 17.7 GHz to about 20.2 GHz. The satellite may be positioned, as part of a satellite constellation, at an altitude between about 5000 km and about 7000 km (e.g., 6000 km). The satellite may transmit communications signals at an RF power between about 200 W to about 400 W (e.g., 300 W) and may have a noise power ratio between about 15 dB to about 30 dB (e.g., 15 dB). The cross-polarization discrimination (XPD) may be greater than about 15 dB. The antenna gain may be about 38 dBi to about 42 dBi (e.g., 40 dBi). The satellite may be allocated a bandwidth of about 20 GHz. The total capacity of the satellite communication system may be at least about 50 Gbps.

In one example, a device is a satellite that may be configured to operate in an E-band at a frequency in a range from about 71 GHz to about 76 GHz. The satellite may be positioned, as part of a satellite constellation, at an altitude between about 400 km and about 600 km (e.g., 500 km). The satellite may transmit communications signals at an RF power of about 40 W. The satellite transmitter may have a noise power ratio of about 15 dB. The XPI may be about 18 dB.

While various embodiments of the present invention have been shown and described herein, it will be obvious to those skilled in the art that such embodiments are provided by way of example only. It is not intended that the invention be limited by the specific examples provided within the specification. While the invention has been described with reference to the aforementioned specification, the descriptions and illustrations of the embodiments herein are not meant to be construed in a limiting sense. Numerous variations, changes, and substitutions will now occur to those skilled in the art without departing from the invention. Furthermore, it shall be understood that all aspects of the invention are not limited to the specific depictions, configurations or relative proportions set forth herein which depend upon a variety of conditions and variables. It should be understood that various alternatives to the embodiments of the invention described herein may be employed in practicing the invention. It is therefore contemplated that the invention shall also cover any such alternatives, modifications, variations, or equivalents. It is intended that the following claims define the scope of the invention and that methods and structures within the scope of these claims and their equivalents be covered thereby.

What is claimed is:

1. A semiconductor structure comprising:
   a layered structure comprising a wide-bandgap semiconductor material;
   a plurality of diamond seeds disposed over at least a portion of the layered structure; and
   an intermediate layer disposed over at least a portion of the plurality of diamond seeds.

2. The semiconductor structure of claim 1, further comprising a layer of material disposed over at least a portion of the intermediate layer, wherein the layer of material has an average value of thermal conductivity equal to or greater than about 1,000 Watts per meter Kelvin (W/m·K).

3. The semiconductor structure of claim 2, wherein the layer of material comprises diamond.

4. The semiconductor structure of claim 2, wherein an interface between the layered structure and the layer of material comprises at least a portion of the plurality of diamond seeds.

5. The semiconductor structure of claim 4, wherein the interface has an average value of thermal boundary resistance from about 1 square meter Kelvin per gigawatt (m² K/GW) to about 12 m² K/GW.

6. The semiconductor structure of claim 4, wherein the interface comprises a material forming a discontinuous layer across a surface of the semiconductor structure.

7. The semiconductor structure of claim 4, wherein the interface is an articulated interface.

8. The semiconductor structure of claim 4, wherein the interface comprises at least a portion of the intermediate layer, and wherein the interface has a thickness greater than about 50 nanometers.

9. The semiconductor structure of claim 4, further comprising a second plurality of diamond seeds disposed over at least a portion of the intermediate layer, wherein the interface comprises at least a portion of the second plurality of diamond seeds.

10. The semiconductor structure of claim 9, wherein the second plurality of diamond seeds has an average diameter less than an average diameter of the plurality of diamond seeds.

11. The semiconductor structure of claim 9, wherein the second plurality of diamond seeds forms a discontinuous layer across a surface of the intermediate layer.

12. The semiconductor structure of claim 9, wherein at least one diamond column from a first diamond seed of the second plurality of diamond seeds and at least one diamond column from a second diamond seed of the second plurality of diamond seeds coalesce at a distance from a surface of the semiconductor structure.

13. The semiconductor structure of claim 1, wherein the plurality of diamond seeds has an average value of thermal conductivity less than about 500 Watts per meter Kelvin (W/m·K).

14. The semiconductor structure of claim 1, wherein the plurality of diamond seeds has an average diameter from about 40 nanometers to about 300 nanometers.

15. The semiconductor structure of claim 1, wherein at least a portion of the plurality of diamond seeds is disposed over and in contact with at least a portion of the layered structure.

16. The semiconductor structure of claim 1, wherein the intermediate layer is configured to attach the plurality of diamond seeds to a surface of the layered structure.

17. The semiconductor structure of claim 1, wherein at least a portion of the intermediate layer is disposed over and in contact with at least a portion of the plurality of diamond seeds.

18. The semiconductor structure of claim 1, wherein at least a portion of the plurality of diamond seeds is disposed between the intermediate layer and the layered structure.

* * * * *